US011183972B2

(12) United States Patent
Choi et al.

(10) Patent No.: US 11,183,972 B2
(45) Date of Patent: Nov. 23, 2021

(54) METHOD FOR ADJUSTING OUTPUT OF AMPLIFIER BY USING SENSING CIRCUIT CONFIGURED TO SENSE POWER SUPPLIED TO AMPLIFIER AND ELECTRONIC DEVICE THEREFOR

(71) Applicant: Samsung Electronics Co., Ltd., Suwon-si (KR)

(72) Inventors: Hyunseok Choi, Suwon-si (KR); Dongil Yang, Suwon-si (KR); Youngju Kim, Suwon-si (KR); Jooseung Kim, Suwon-si (KR); Sanghun Sim, Suwon-si (KR); Youngmin Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 49 days.

(21) Appl. No.: 16/710,736

(22) Filed: Dec. 11, 2019

(65) Prior Publication Data

US 2020/0186090 A1 Jun. 11, 2020

(30) Foreign Application Priority Data

Dec. 11, 2018 (KR) ........................ 10-2018-0159170

(51) Int. Cl.
*H03F 1/02* (2006.01)
*H03F 1/52* (2006.01)
(Continued)

(52) U.S. Cl.
CPC ............. *H03F 1/0205* (2013.01); *H03F 1/52* (2013.01); *H03F 3/19* (2013.01); *H03F 3/21* (2013.01)

(58) Field of Classification Search
CPC . H03F 1/0205; H03F 1/52; H03F 3/19; H03F 3/21
(Continued)

(56) References Cited

U.S. PATENT DOCUMENTS 8,344,806 B1 1/2013 Franck et al.
2002/0183019 A1 12/2002 Dent et al.
(Continued)

FOREIGN PATENT DOCUMENTS

JP 6-309046 A 11/1994
JP 2003-17955 A 1/2003
JP 2004-080913 A 3/2004

OTHER PUBLICATIONS

International Search Report and Written Opinion dated Mar. 20, 2020, issued in International Application No. PCT/KR2019/017496.

*Primary Examiner* — Hafizur Rahman
(74) *Attorney, Agent, or Firm* — Jefferson IP Law, LLP

(57) ABSTRACT

An electronic device is provided. The electronic device includes an antenna, an amplification circuit configured to amplify a signal to be transmitted through the antenna, a first sensing circuit configured to sense first information corresponding to a voltage value of power supplied to the amplification circuit, a second sensing circuit configured to sense second information corresponding to a current value of the power, and a protective circuit. The protective circuit may be configured to summate the first information and the second information into a single parameter, to determine whether a summation value corresponding to the single parameter deviates from an operating area determined by characteristics of the amplification circuit, and to adjust an output of the amplification circuit if the summation value deviates from the operating area.

20 Claims, 16 Drawing Sheets

[411]

[412]

[413]

(51) Int. Cl.
*H03F 3/19* (2006.01)
*H03F 3/21* (2006.01)

(58) Field of Classification Search
USPC .......................................................... 330/250
See application file for complete search history.

(56) References Cited

U.S. PATENT DOCUMENTS

| | | |
|---|---|---|
| 2003/0011429 A1 | 1/2003 | Kizaki |
| 2006/0119434 A1 | 6/2006 | Siew et al. |
| 2009/0128233 A1 | 5/2009 | Camuffo et al. |
| 2015/0349731 A1 | 12/2015 | Kwon et al. |
| 2016/0156318 A1 | 6/2016 | Mnayak |
| 2017/0324380 A1 | 11/2017 | Liu |
| 2018/0159313 A1 | 6/2018 | Hirose |
| 2018/0199404 A1 | 7/2018 | Wang et al. |

METHOD FOR ADJUSTING OUTPUT OF AMPLIFIER BY USING SENSING CIRCUIT CONFIGURED TO SENSE POWER SUPPLIED TO AMPLIFIER AND ELECTRONIC DEVICE THEREFOR

CROSS-REFERENCE TO RELATED APPLICATION(S)

This application is based on and claims priority under 35 U.S.C. § 119(a) of a Korean patent application number 10-2018-0159170, filed on Dec. 11, 2018, in the Korean Intellectual Property Office, the disclosure of which is incorporated by reference herein in its entirety.

BACKGROUND

1. Field

The disclosure relates to a power amplifier (PA) and an electronic device including the same. More particularly, the disclosure relates to a power amplifier and an electronic device configured to protect the power amplifier from damage.

2. Description of the Related Art

Mobile electronic devices may include power amplifiers (PAs) configured to amplify radio frequency (RF) signals. A high bias needs to be applied to power amplifiers in order to improve the transmission performance and the maximum output may be defined according to the specifications or characteristics of semiconductor elements used for the RF power amplifiers. Power amplifiers based on heterojunction bipolar transistors (HBT) have recently been used widely as amplification circuits due to the linearity and power handling ability thereof.

If the voltage of output signals from power amplifiers increases abnormally, the performance of power amplifiers may be degraded or the power amplifier may be damaged. Power amplifiers are designed such that elements (for example, transistors) included in the power amplifiers operate within a safe operating area (SOA) in which the same can operate without being damaged, and include protective circuits configured to detect overdriven or overloaded states of the elements, thereby protecting the same.

The above information is presented as background information only to assist with an understanding of the disclosure. No determination has been made, and no assertion is made, as to whether any of the above might be applicable as prior art with regard to the disclosure.

SUMMARY

In general, power amplifiers have protective circuits which operate so as to determine overload signals with reference to the maximum current (Imax) or with reference to the minimum voltage (Vmin) or maximum voltage (Vmax) of power amplification circuits, and the protective circuits control such that, if one of the voltage or output currents exceeds a predetermined level, the bias value is reduced, or the power amplifiers are shut down.

However, in spite of monitoring voltages or currents, driving of power amplifiers in a range outside the safe operating area (SOA) cannot be protected, and this causes loss of the power amplifiers. There is also a problem in that parasitic components of elements included in the power amplifiers change the linearity of the elements, or an impedance change makes it impossible to operate the power amplifiers within a voltage or current range in which the same can be protected.

In the case of a recent fifth generation (5G) network that uses microwave-band operating frequencies, the operating frequency band of power amplifiers may be extended to a higher frequency band as higher power is required. Consequently, the operating area in which the power amplifiers can operate with minimized damage may have a reduced range (for example, fast operating area (FOA)) compared with the safe operating area. Accordingly, there is a need for a scheme for suppressing loss of power amplifiers while satisfying not only the safe operating area, but also the reduced operating area.

Aspects of the disclosure are to address at least the above-mentioned problems and/or disadvantages and to provide at least the advantages described below. Accordingly, an aspect of the disclosure is to provide a power amplifier and an electronic device configured to protect the power amplifier from damage.

Additional aspects will be set forth in part in the description which follows and, in part, will be apparent from the description, or may be learned by practice of the presented embodiments.

In accordance with an aspect of the disclosure, an electronic device is provided. The electronic device includes an antenna, an amplification circuit configured to amplify a signal to be transmitted through the antenna, a first sensing circuit configured to sense first information corresponding to a voltage value of power supplied to the amplification circuit, a second sensing circuit configured to sense second information corresponding to a current value of the power, and a protective circuit. The protective circuit may be configured to summate the first information and the second information into a single parameter, to determine whether a summation value corresponding to the single parameter deviates from an operating area determined by characteristics of the amplification circuit, and to adjust an output of the amplification circuit if the summation value deviates from the operating area.

In accordance with another aspect of the disclosure, an electronic device is provided. The electronic device includes an antenna, a power supply module, and a power amplification module connected to the power supply module. The power amplification module may be configured to amplify, based on an amplification circuit, a signal output to the antenna, to sense first information corresponding to a voltage value of power supplied when the signal is amplified, to sense second information corresponding to a current value of the power, to summate the first information and the second information into a single parameter, to determine whether the summation value corresponding to the single parameter deviates from an operating area determined by element characteristics of the amplification circuit, and to deliver an overload signal to the power supply module if the summation value deviates from the operating area. The power supply module may be configured to adjust the voltage applied to the amplification circuit module or to block power supply thereto if the overload signal is received from the power amplification module.

An electronic device according to various embodiments may be implemented such that voltage and current of a power amplifier are sensed, and the power amplifier can operate within an operating area in which the same can operate safely based on the voltage and current.

An electronic device according to various embodiments may detect overdriving or overloading of a power amplifier, which reflects a change in the linearity of elements included in the power amplifier due to parasitic components, or an aspect of the impedance change such that the power amplifier can operate within a voltage or current range in which the same is protected.

An electronic device according to various embodiments has a power amplifier implemented to operate within a range that satisfies not only the safe operating area, but also a range (for example, fast operating area) that is reduced in view of microwave band-based 5G, thereby improving the effect of suppressing loss of the power amplifier.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspect, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

An electronic device according to various embodiments may be one of various types of electronic devices. The electronic devices may include, for example, a portable communication device (e.g., a smart phone), a computer device, a portable multimedia device, a portable medical device, a camera, a wearable device, a home appliance, or the like. According to an embodiment of the disclosure, the electronic devices are not limited to those described above.

Figure 1:
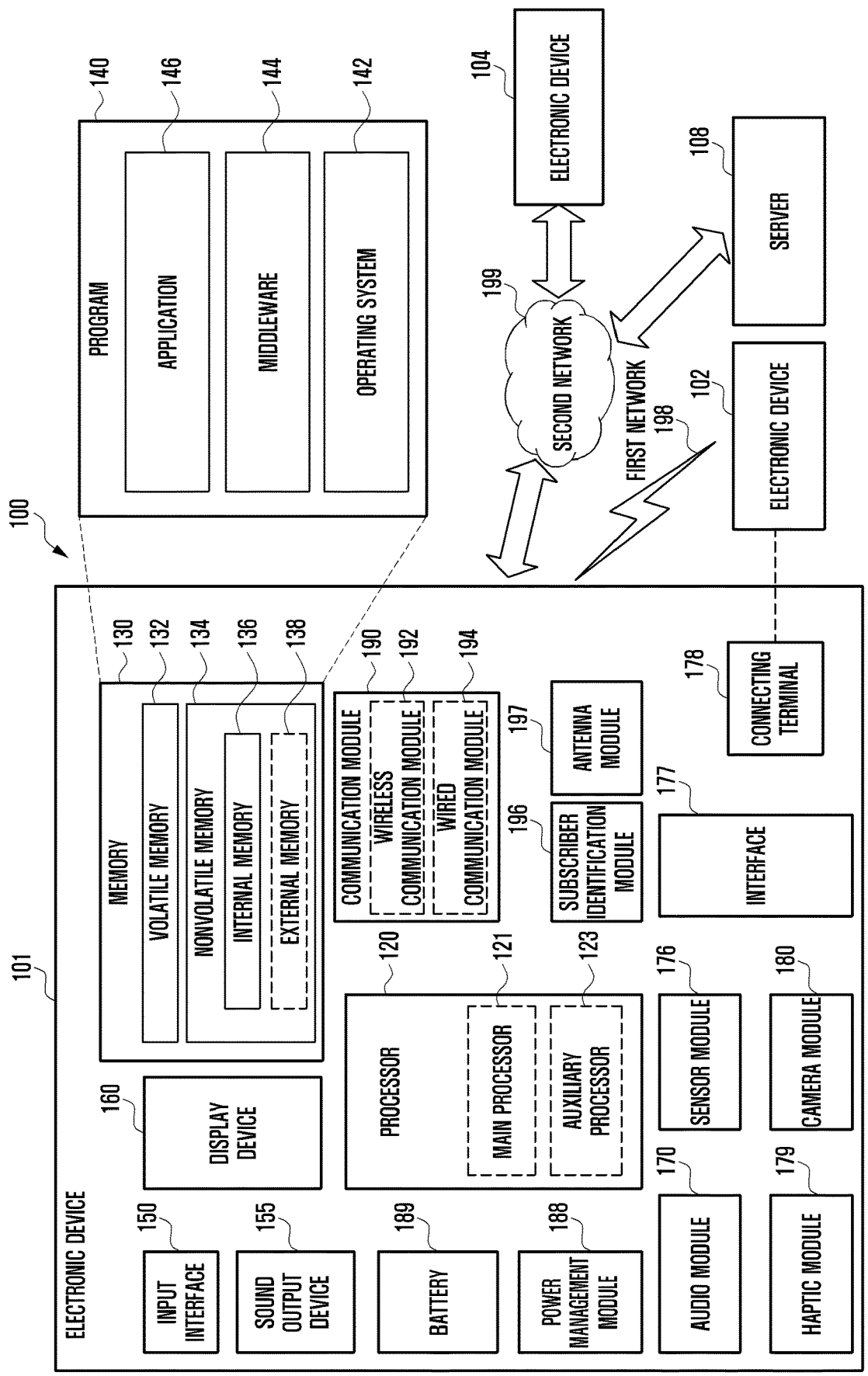
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
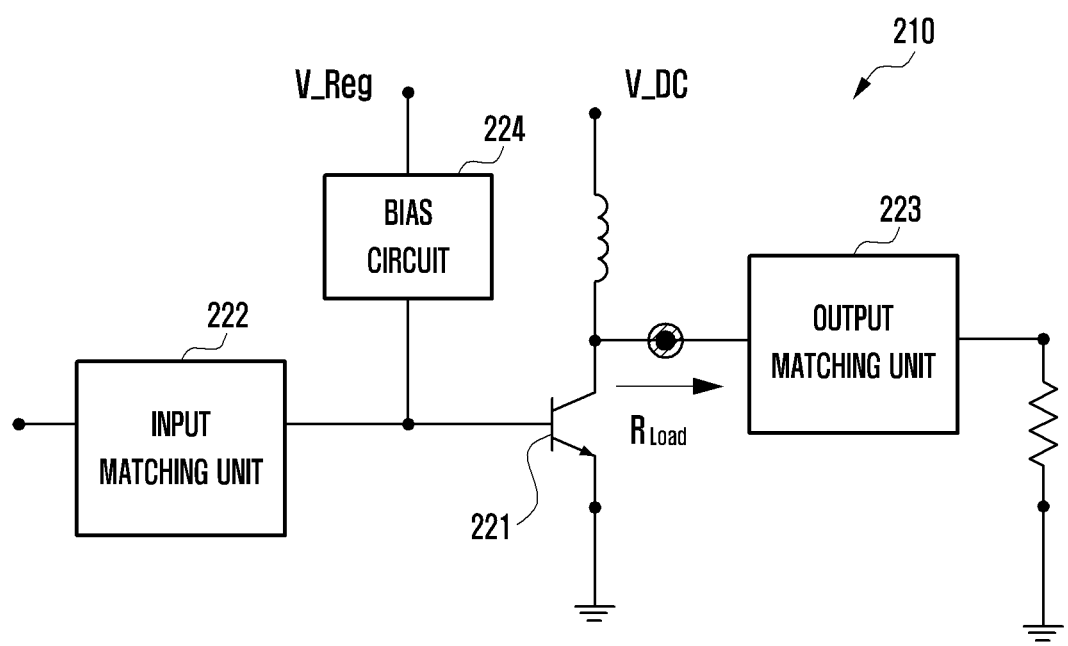
FIG. 2A illustrates an example of a heterojunction bipolar transistor (HBT) power amplification circuit of an electronic device according to an embodiment of the disclosure.
Figure 2B:
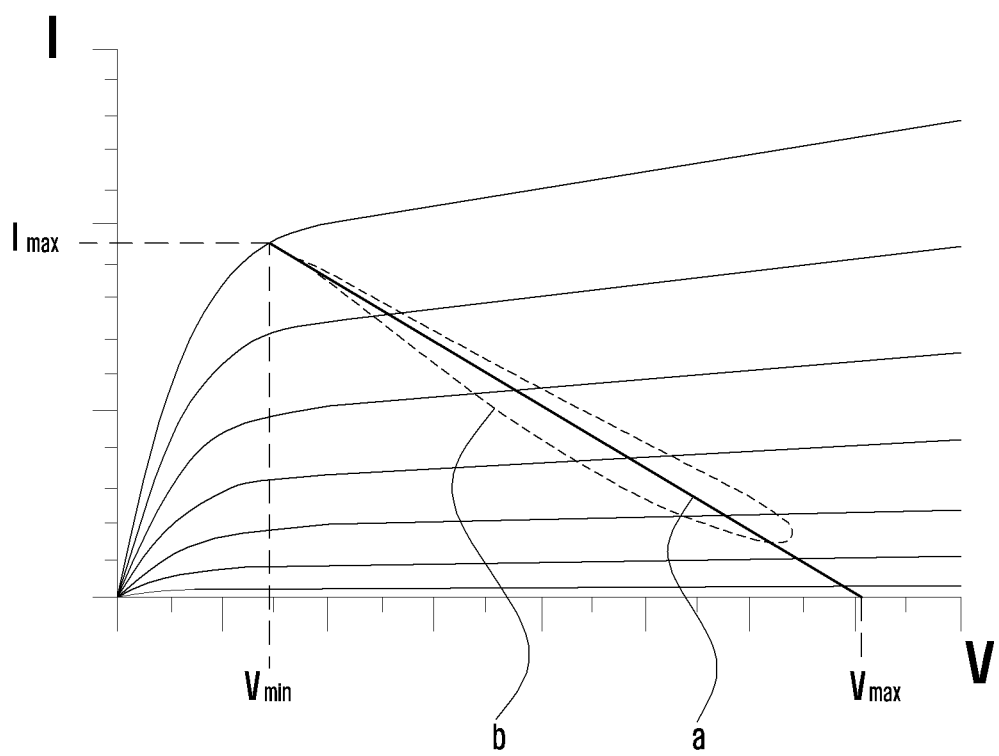
FIG. 2B is a voltage-current curve graph according to characteristics of an HBT element according to an embodiment of the disclosure.

FIG. 2A illustrates an example of a heterojunction bipolar transistor (HBT) power amplification circuit of an electronic device according to an embodiment of the disclosure, and FIG. 2B is a voltage-current curve graph according to characteristics of an HBT element according to an embodiment of the disclosure.

Referring to FIGS. 2A and 2B, an electronic device according to an embodiment (for example, electronic device 101 of FIG. 1) may have a power amplification circuit 210 included in the communication module 190 of FIG. 1.

According to an embodiment, the power amplification circuit 210 may be included in a radio frequency (RF) front end (RFFE) configured to acquire a signal from a radio frequency integrated circuit (RFIC) during transmission, to postprocess the same, and to deliver the same to the antenna, and configured to postprocess a signal acquired from the antenna during reception and to deliver the same to the RFIC.

The power amplification circuit 210 may amplify an input end signal (RFin) delivered from an RF processing module (for example, RFIC inside the wireless communication module 192 of FIG. 1) by using a bias voltage, and may deliver the amplified signal to the antenna.

According to an embodiment, the power amplification circuit 210 may include an HBT element 221, an input matching unit 222 configured to compensate for loss of an RF signal between the input end RFin and the HBT element 221, an output matching unit 223 configured to match impedance between the HBT element 221 and the output end RFout, and a bias circuit 224 configured to vary the magnitude of bias applied to the HBT element 221 through the bias circuit.

According to an embodiment, the power amplification circuit 210 may be configured to adjust the load resistance value Rload of a terminal of the HBT element 221, which is connected to the output matching unit 223, such that a desired RF signal is generated. The load resistance value Rload may be determined by the power supply voltage V_DC and the peak power required by the power amplification circuit 210.

For example, the power amplification circuit 210 may be configured such that the magnitude of the load resistance value Rload is adjusted according to a load line that reflects a voltage-current curve in order to amplify signals with maximum power so as to reflect characteristics of the element. The power amplification circuit 210 may vary the magnitude of the load resistance value Rload in view of parameters such as loss resulting from output impedance matching, frequency characteristics, and limited Q.

In addition, the power amplification circuit 210 may be configured such that the voltage changes between the minimum voltage (Vmin) and the maximum voltage (Vmax) resulting from element characteristics, and such that the load line is included inside a range in which the maximum current (Imax) is not exceeded, for example, inside an operating area configured such that elements of the power amplification circuit 210 can operate without being damaged.

The electronic device 101 according to an embodiment may sense a current and a voltage applied to the HBT element 221 such that the power amplification circuit 210 can operate within the configured operating area. The electronic device 101 may be configured to convert the current and the voltage into a single parameter such that, even if a difference in the load line occurs due to an external factor, the same can operate within the configured operating area without loss of elements. For example, as illustrated in FIG. 2B, a refers to an ideal load line during design, which reflects a voltage (V)-current (I) curve according to element characteristics, and b refers to a load line actually measured at the output end of the power amplification circuit 210 due to a parasitic component such as a parasitic capacitor.

In general, when a power amplification circuit is implemented, the load line for adjusting the magnitude of the load resistance value is configured to be positioned inside an operating area configured such that elements of the power amplification circuit can operate without loss. However, it can be confirmed that, when the power amplification circuit operates, a difference in the load line of the power amplification circuit occurs due to a parasitic capacitor, as indicated by b, and the same changes to an elliptical shape. Alternatively, if the collector voltage of the HBT power amplification circuit increases, or if the load is changed, the trajectory of the load line may change as indicated by b. As such, the load line of the power amplification circuit may change due to an increase in the power supply voltage, antenna load, and/or impedance resulting from a parasitic capacitance. Accordingly, the power amplification circuit may operate outside the configured SOA and fast operating area (FOA), thereby generating loss of the power amplification circuit.

The electronic device 101 according to an embodiment may determine whether the power amplification circuit 210 operates within an operating area that reflects the aspect of an actually measured load line with reference to a value obtained by assigning weights to sensed currents and voltages of the HBT element 221 and summating the same. If the power amplification circuit 210 deviates from the configured operating area, the electronic device 101 may adjust the output of the HBT element 221. For example, the electronic device 101 may be configured to lower the output of the HBT element 221 such that the amplification circuit operates within the configured operating range, or may block power supply to the power amplification circuit 210.

The electronic device 101 according to an embodiment may be configured such that the power amplification circuit 210 operates within a range that satisfies not only the SOA, but also a range (for example, FOA) that is reduced in view of 5G that uses microwave bands.

Figure 3:
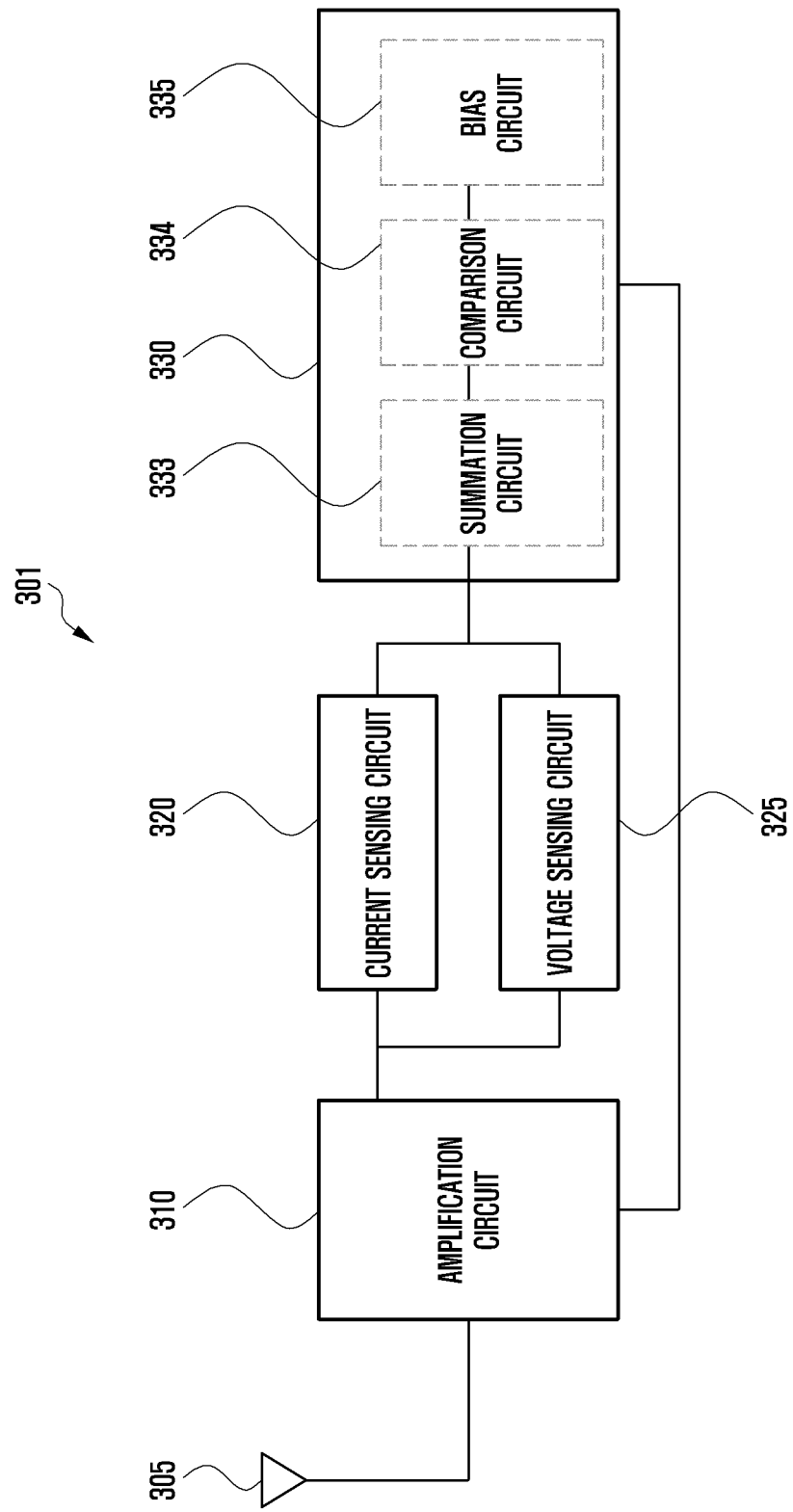
FIG. 3 illustrates a structure of a power amplification module of an electronic device according to an embodiment of the disclosure.

FIG. 3 illustrates a structure of a power amplification module of an electronic device according to an embodiment of the disclosure.

Referring to FIG. 3, a power amplification module 301 of an electronic device according to an embodiment (for example, electronic device 101 of FIG. 1) may include an amplification circuit 310 (for example, power amplification circuit of FIG. 2A), a current sensing circuit 320, a voltage sensing circuit 325, and a protective circuit 330.

According to an embodiment, the protective circuit 330 may include a bias circuit 335 but is not limited thereto. The bias circuit 335 may be implemented separately from the protective circuit 330.

According to an embodiment, the protective circuit 330 may be implemented to include at least some of the current sensing circuit 320, the voltage sensing circuit 325, a summation circuit 333, a comparison circuit 334, and/or the bias circuit 335.

According to an embodiment, the amplification circuit 310 may amplify an input end signal (RFin) delivered from the RF processing module (for example, RFIC) by using a bias voltage, and may deliver the amplified signal to an antenna 305. The amplified RF signal may be output to the antenna 305 through the output end (RFout). For example, the amplification circuit 310 may be configured having a structure of the power amplification circuit 210 of FIG. 2A, but is not limited thereto.

According to an embodiment, the amplification circuit 310 may include at least one of a driver amplifier (DA) configured to adjust the gain of a signal input through the input end and a power amplifier (PA) configured to amplify the gain-adjusted RF signal.

The DA may receive, as a power supply, a DC-DC voltage or a battery voltage (V-batt) input from the power supply module, may amplify the signal input to the DA, and may output the same as a driver signal. The DA may minimize linearity performance degradation and power loss through inter-stage matching with the PA, and deliver the signal to the PA.

The PA is connected to the output end of the DA. The PA may receive, as a power supply, a DC-DC voltage or a battery voltage (V-batt) input from the power supply module, may amplify a driver signal input to the PA, and may output the resulting power signal to the output end (RFout).

According to some embodiments, the PA may use a multi-mode in order to improve the power efficiency with regard to each output power. For example, the PA may include at least one transistor, and may control the number of transistors that are turned on in response to the maximum output power.

According to an embodiment, the current sensing circuit 320 may be connected to the collector end of a transistor included in the amplification circuit 310, and may sense a current flowing to the transistor through a power supply voltage (for example, Vcc) applied to the amplification circuit 310.

According to an embodiment, the voltage sensing circuit 325 may be connected to the power supply voltage (Vcc) of the amplification circuit 310, and may sense the voltage applied to the amplification circuit 310.

According to an embodiment, the protective circuit 330 may confirm (for example, using a sensor) whether the current or voltage flowing through the amplification circuit 310 exceeds a threshold while a bias current is applied to the amplification circuit 310 so as to amplify signals. Accordingly, the protective circuit 330 may determine whether the amplification circuit 310 is driven within an operating area range configured such that the same can operate safely, and may adjust the output of the amplification circuit 310 if the same is out of the configured operating area.

According to an embodiment, if the amplification circuit 310 is driven outside the range of the configured operating area while amplifying signals, the protective circuit 330 may conduct a control such that the output applied to the amplification circuit 310 decreases, or may block power supply to the amplification circuit 310.

According to an embodiment, the protective circuit 330 may include at least some of the summation circuit 333, the comparison circuit 334, and the bias circuit 335 (for example, bias circuit 224 of FIG. 2A).

According to some embodiments, the protective circuit 330 may include a conversion circuit (not illustrated) configured to convert a current or a voltage into a single parameter.

According to some embodiments, the summation circuit 333 may include the comparison circuit 334.

According to an embodiment, the summation circuit 333 may summate a current sensed through the current sensing circuit 320 and a voltage sensed through the voltage sensing circuit 325 into a single parameter, and may deliver the summation value of current and voltage to the comparison circuit 334. The summation value of current and voltage may be referred to as a voltage summation (Vtotal) value, but is not limited thereto.

For example, the summation circuit 333 may be configured to change a current flowing to the transistor (TR) of the amplification circuit 310, sensed through the current sensing circuit 320, into a voltage (for example, a first voltage) and to summate (for example, Vtotal), with reference to a voltage (for example, second voltage) sensed through the voltage sensing circuit 325, the first voltage and the second voltage. As another example, the summation circuit 333 may be configured to change a current (for example, first current) sensed through the current sensing circuit and a voltage sensed through the voltage sensing circuit 325 into a current (for example, second current) and to summate (for example, Itotal) the first current and the second current with reference to the current. The summation circuit 333 may convert the current summation (for example, Itotal) into a voltage summation (for example, Vtotal) by using a resistance, and may deliver the voltage summation value to the comparison circuit 334.

According to an embodiment, the summation circuit 333 may be configured such that a weight is assigned to each current or voltage according to the characteristics of the transistor element included in the amplification circuit 310, thereby confirming the summation value. For example, the summation circuit 333 may be configured such that a voltage sensed through the voltage sensing circuit 325 is multiplied by weight A, a current sensed through the current sensing circuit 320 is multiplied by weight B, and then the summation value is confirmed. For example, the summation value may be confirmed by using a first-order equation of (A*x)+(B*y), but an equation of the second or higher order may be used in some cases. In the equation, x and y may correspond to values obtained by changing a circuit current sensed through current sensing or a voltage sensed through voltage sensing into a single parameter. For example, in terms of currents, x and y may refer to first and second currents, respectively, and in terms of voltages, x and y may be understood as first and second voltages, respectively.

According to an embodiment, the comparison circuit 334 may determine whether the summation value delivered from the summation circuit 333 deviates from the operating area configured such that the amplification circuit 310 can operate safely. If the summation value is outside the configured operating area, the comparison circuit 334 may deliver an overload signal to the bias circuit 335 so as to inform that the amplification circuit 310 is outside the configured operating area.

According to an embodiment, the bias circuit 335 may be connected to the amplification circuit 310 so as to supply a bias current to the amplification circuit 310. The bias circuit 335 may vary the bias current such that the same is amplified into a desired signal through the amplification circuit 310 and output. The bias circuit 335 may adjust the PA bias current so as to conduct a control such that the shape of the load line on the voltage-current curve is adjusted.

According to an embodiment, the bias circuit 335 may adjust the magnitude of the bias current such that the output of the amplification circuit 310 is adjusted by the overload signal of the amplification circuit 310, delivered from the comparison circuit 334, or may block power supply to the amplification circuit 310. For example, the bias circuit 335 may make adjustment such that, if the overload signal is received, the bias current of the amplification circuit 310 decreases.

The bias circuit 335 according to an embodiment may have a load line configured within an operating area (for example, first operating area and second operating area) in which elements can operate without being damaged, for example, so as to correspond to 5G mobile communication. For example, an operating area configured such that the amplification circuit 310 can operate safely may be an at least partially overlapping area between a first operating area determined in response to characteristics of circuit elements (for example, transistor, resistor, and the like) constituting the amplification circuit and a second operating area determined in view of the microwave-based operating frequency characteristics. The first operating area according to an embodiment may be an SOA determined by characteristics of an element (for example, HBT element) of the amplification circuit. The second operating area according to an embodiment may be an operating area (for example, an FOA) reduced as compared with the SOA as the operating frequency increases. The second operating area (for example, FOA) is reduced as compared with the first operating area when approaching the cutoff frequency (Ft) or maximum oscillation frequency (Fmax) supported by the elements. The second operating area may be further reduced if millimeter-wave frequency band signals increase. For example, the SOA and the FOA may be determined by the characteristics of circuit elements (for example, transistor, resistor, and the like) constituting the amplification circuit and the size of the elements.

Figure 4:
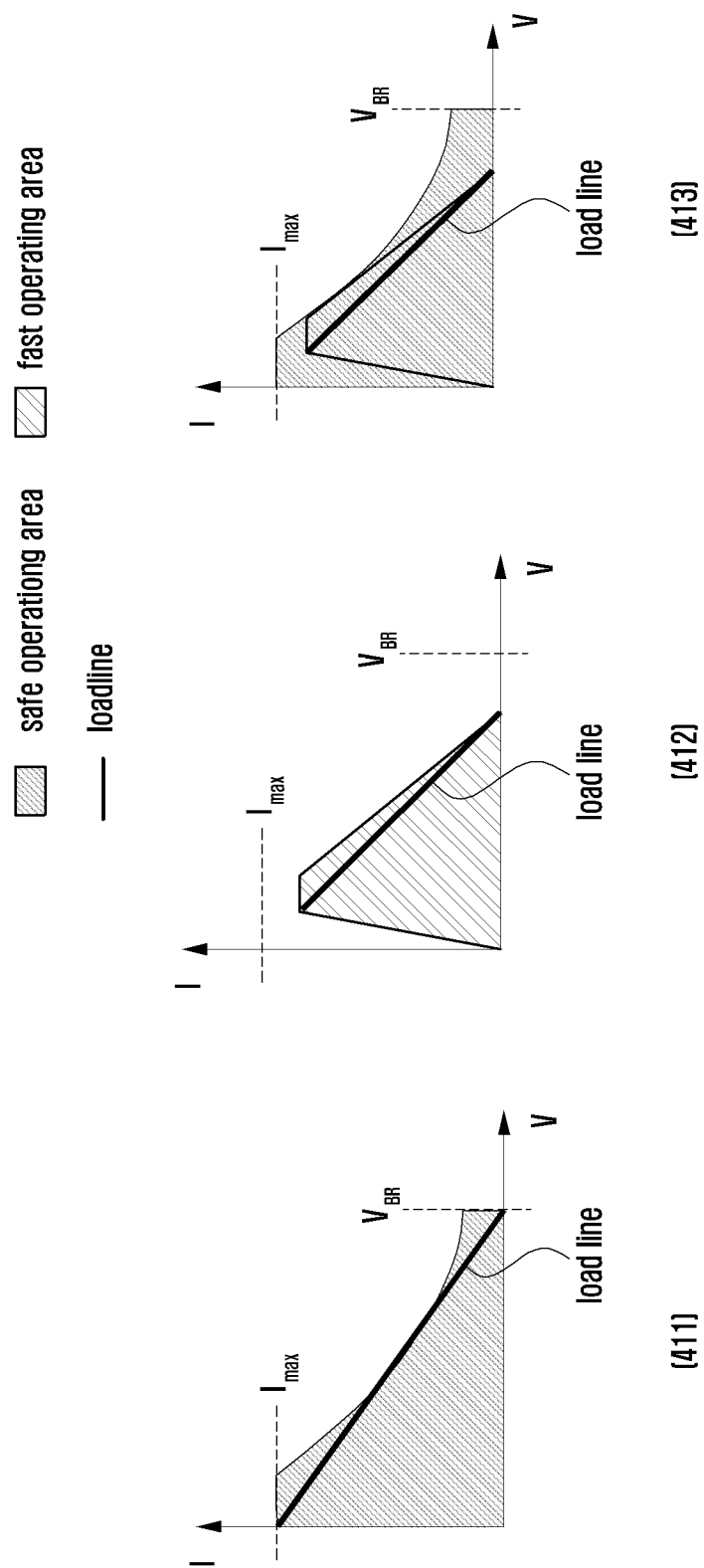
FIG. 4 illustrates a correlation between a safe operation area (SOA) or a fast operating area (FOA) based on characteristics of an HBT element and a load line according to an embodiment of the disclosure.

FIG. 4 illustrates a correlation between an SOA area or an FOA area based on characteristics of an HBT element and a load line according to an embodiment of the disclosure.

Referring to FIG. 4, the SOA and the FOA correspond to a voltage range and a current range in which the HBT element can operate without being damaged, respectively. In FIG. 4, Vmax may be a value configured such that the element operates below the breakdown voltage (Vbr), and Imax may be a value configured such that the element operates below the maximum current. Imax may be determined by the maximum current density allowed per unit and by the element size.

As illustrated in FIG. 4, 411 refers to a load line configured within the SOA, 412 refers to a load line configured within the FOA that is reduced as compared with the SOA, and 413 refers to a load line configured in view of both the SOA and the FOA. In FIGS. 4, 411, 412, and 413 may correspond to ideal load lines, and a load line during actual measurement may have a different shape due to an external factor, as illustrated in FIG. 2B. This may result in a case in which the amplification circuit 310 operates outside the SOA and FOA.

The bias circuit 335 according to an embodiment may have a load line configured within a range that satisfies both the SOA and FOA as in 413 of FIG. 4.

The power amplification module 301 according to an embodiment may assign weights to currents and voltages by the protective circuit 330 and summate the same, thereby determining whether the amplification circuit 310 is outside the operating range in view of the load line during actual measurement, and may adjust the bias of the amplification circuit 310 if the same is outside the operating range.

Figure 5:
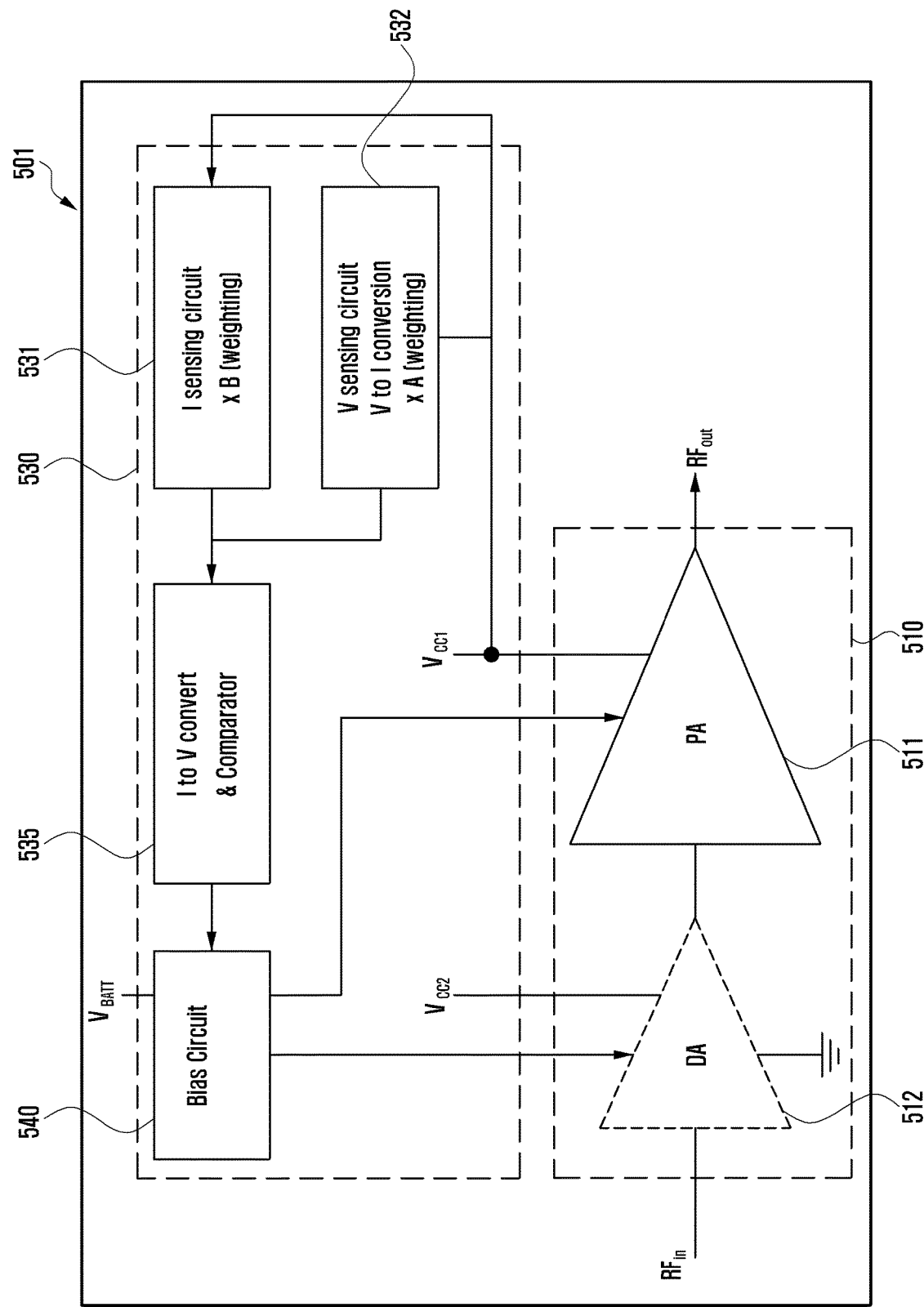
FIG. 5 illustrates a structure of a power amplification module of an electronic device according to an embodiment of the disclosure.

FIG. 5 illustrates a structure of a power amplification module of an electronic device according to an embodiment of the disclosure.

Figure 6:
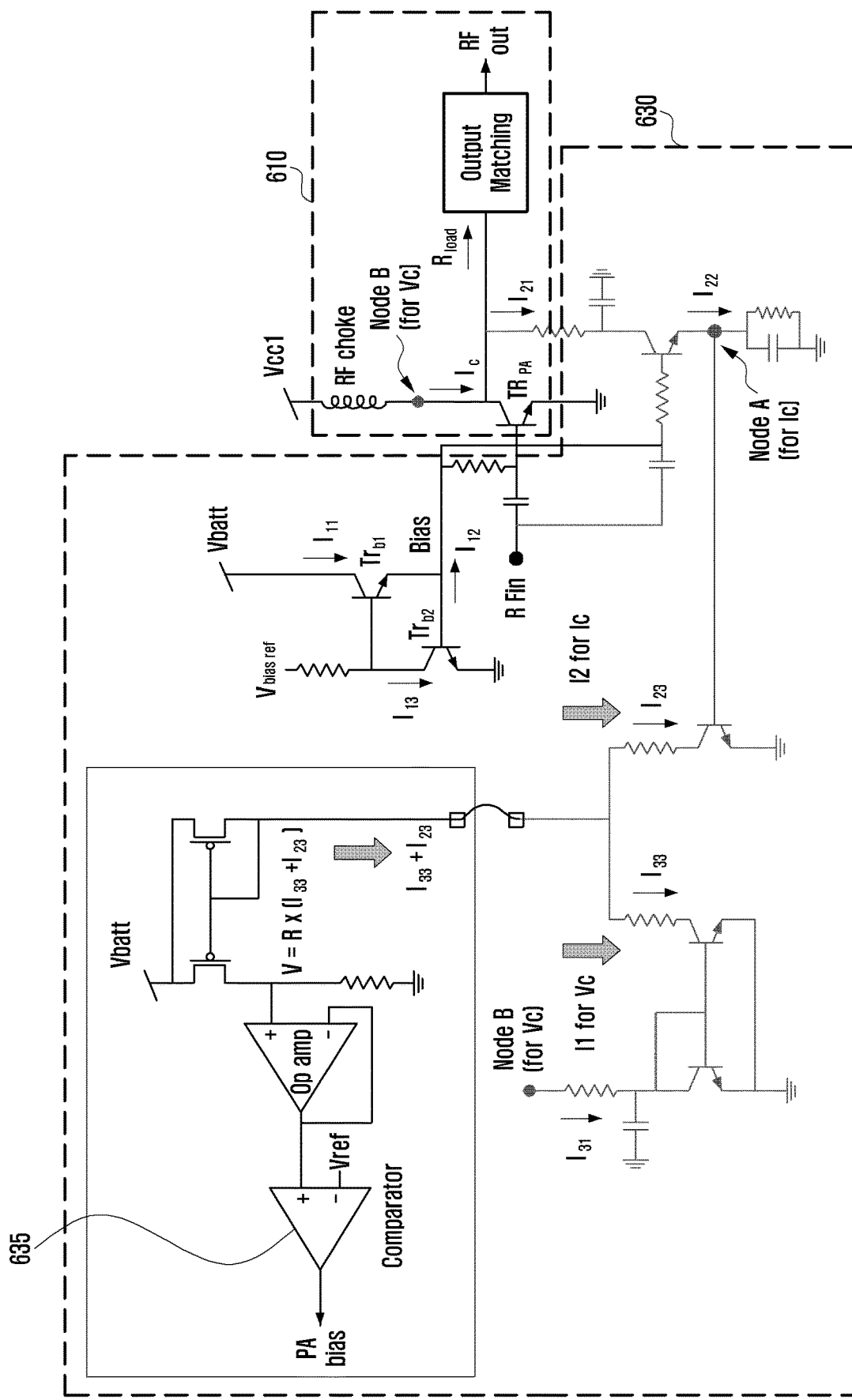
FIG. 6 is a circuit diagram corresponding to an HBT power amplification module according to an embodiment of the disclosure.

FIG. 6 is a circuit diagram corresponding to an HBT power amplification module according to an embodiment of the disclosure.

Referring to FIGS. 5 and 6, a power amplification module 501 (for example, power amplification module 301 of FIG. 3) of an electronic device (for example, electronic device 101 of FIG. 1) according to an embodiment may include an amplification circuit 510 (for example, amplification circuit 310 of FIG. 3) and a protective circuit 530.

According to an embodiment, the protective circuit 530 may conduct a control such that a bias current is applied to the amplification circuit 510 so as to amplify signals, and may operate so as to protect the amplification circuit 510 with reference to a value obtained by summating currents and voltages sensed by the amplification circuit 510 based on a current parameter.

According to an embodiment, the protective circuit 530 may include a current sensing circuit (I sensing circuit) 531, a voltage sensing/conversion circuit (V sensing circuit & V to I conversion) 532, a comparison circuit (comparator) 535, and a bias circuit 540. The comparator 535 may further include a current-voltage converter.

According to an embodiment, the protective circuit 530 may further include the bias circuit 540 but is not limited thereto. The bias circuit 540 may be implemented separately from the protective circuit 530.

According to an embodiment, the amplification circuit 510 may include at least one of a driver amplifier (DA) 512 configured to adjust the gain of a signal input through the input end and a power amplifier (PA) 511 configured to amplify the gain-adjusted RF signal. The DA 512 of the amplification circuit 510 may be omitted. However, the embodiment is not limited thereto. The amplification circuit 510 may amplify and output an input signal by receiving a DC-DC voltage or a battery voltage (V-batt) applied thereto as a power supply (for example, Vcc1 or Vcc2). According to an embodiment, the bias circuit 540 may be connected to the amplification circuit 510 so as to supply a bias current to the amplification circuit 510. The bias circuit 540 may receive a battery voltage (V-batt) applied thereto as a power supply and may supply a bias current to the amplification circuit.

The bias circuit 540 may receive a signal from the comparator 535 regarding whether the amplification circuit 510 is operating within the configured operating area. The bias circuit 540 may receive an overload signal from the comparator 535 indicating that the amplification circuit 510 is operating outside the configured operating area.

According to an embodiment, if the amplification circuit 510 is operating outside the configured operating area, the bias circuit 540 may conduct a control such that, by decreasing the bias current of the amplification circuit 510, the amplification circuit 510 again operates within the configured operating range.

According to some embodiments, if the amplification circuit 510 is operating outside the configured operating area, the bias circuit 540 may conduct a control such that power supply to the power amplification module 501 is blocked.

According to some embodiments, if the amplification circuit 510 is operating outside the configured operating area, the bias circuit 540 may deliver an overload signal to an external control circuit (for example, power supply module or DC-DC converter) so as to inform that the amplification circuit 510 is outside the configured operating area. The external control circuit may adjust the power amplification module 501 based on the overload signal delivered from the bias circuit 540. For example, the bias circuit 540 may lower the output applied to the amplification circuit 510 or block power supply to the amplification circuit 510. According to an embodiment, the bias circuit 540 may not adjust the output value (for example, current applied to the amplification circuit) of the bias circuit 540 if it is confirmed based on the signal delivered from the comparator 535 that the amplification circuit 510 is operating within the configured operating area, and may make adjustment such that the output value of the bias circuit 540 decreases only if the same is operating outside the configured operating area.

According to an embodiment, the current sensing circuit 531 may sense a current flowing to the collector end of the transistor included in the amplification circuit 510, may generate a mirrored current (for example, first current) with reference to the sensed current, and may deliver the same to the comparator 535. According to an embodiment, the current sensing circuit 531 may multiply the first current by a predetermined amplification ratio B and deliver the resulting value to the comparator 535.

According to an embodiment, the voltage sensing/conversion circuit 532 may be connected to the power supply voltage (for example, Vcc) applied to the amplification circuit 510 so as to sense the voltage applied to the amplification circuit 510, to convert the sensed voltage into a current, to generate a mirrored current (for example, second current) with reference to the converted current, and to deliver the same to the comparator 535. According to an embodiment, the voltage sensing/conversion circuit 532 may multiply the second current by a predetermined amplification ratio A and deliver the resulting value to the comparator 535.

According to an embodiment, the amplification ratio B by which the first current is multiplied and the amplification ratio A by which the second current is multiplied may be changed differently according to characteristics of the HBT element, and may be determined so as to correspond to the boundary shape of the configured operating area (for example, SOA and FOA ranges).

According to an embodiment, the comparator 535 may summate delivered first and second currents and may deliver an overload signal to the bias circuit 540 if the summation value of the first and second currents exceeds a configured threshold value. The comparator 535 may configure the threshold value such that the operating area in which elements can operate safely (for example, SOA and FOA ranges) are not exceeded.

According to an embodiment, the current summation value (Itotal) may be changed to a voltage value (Vtotal) for monitoring the overloading of the amplification circuit 510. The comparator 535 may determine whether the configured threshold value is exceeded with reference to the voltage value (Vtotal) of monitoring.

According to an embodiment, the protective circuit 530 may assign weights to the amplification ratio B by which the first current is multiplied and the amplification ratio A by which the second current is multiplied, respectively, and summate the same, thereby determining whether the amplification circuit is operating within the configured operating area (for example, SOA and FOA ranges).

For example, a description will be made with reference to a circuit diagram of a comparator 535 including an amplification circuit (DA).

Referring to FIG. 6, the power amplification module may include an amplification circuit 610 and a protective circuit 630. However, this description of the power amplification module is for convenience only and is not limiting in any manner. In FIG. 6, Trb1 and Trb2 refer to HBT elements of the bias circuit, and TRpa refers to an HBT element of the amplification circuit 610. RFin refers to an RF signal input terminal, RFout refers to an RF signal output terminal, Vcc refers to a power supply voltage, and Vbias_ref refers to a voltage for bias configuration based on an applied voltage Vcc1. In addition, I11-I13 refer to currents flowing inside the bias circuit, and Ic refers to a collector current of TRpa. In the bias circuit, the base electrode of Trb1 and the collector electrode of Trb2 are connected to the bias configuration terminal to which V bias_ref is applied, and the base electrode of Trb2 is connected to the emitter electrode of Trb1.

In the bias circuit, the bias configuration voltage V bias_ref may be applied to the base electrode of Trb1, and current I11 may be amplified and output (I12) as the emitter current of Trb1 according to the voltage magnitude of V bias_ref. Current I12 may be supplied as a bias current of the amplification circuit TRpa.

In the amplification circuit 610, if an RF signal is input to terminal RFin, the same may be input to the base electrode of TRpa, and the collector current Ic of TRpa and the voltage between the collector and the emitter may be amplified according to the magnitude of the RF signal. Signal-amplified power may be output from terminal RFout through an output matching circuit.

The protective circuit 630 may be connected to a current detecting end (node A) configured to sense a current flowing from the collector end of TRpa, and may be connected to the amplification circuit 610 through the voltage detecting end (node B) of the collector end of TRpa.

The protective circuit 630 may amplify a flowing reference current I21 based on Ic that flows to the collector end of TRpa, may generate a current (I22) amplified through the current detecting end (node A), and may sense a mirrored current I23 (for example, I23=N*I22). The current may be sensed as a value obtained by multiplying the current input to the base of the transistor of the protective circuit 630 by a predetermined amplification ratio.

The protective circuit 630 may sense the voltage applied to the collector of TRpa by the voltage detecting end (node B), may generate a current I31 based on the sensed voltage by using a resistance, and may sense a mirrored current I33.

The protective circuit 630 may summate I23 based on current sensing and I33 based on voltage and deliver the same to a comparator 635. The protective circuit may change the current value (Itotal) obtained by adding I23 and I33 into a voltage summation value (Vtotal) by using a resistance and may determine whether the voltage summation value exceeds a threshold value configured through the comparator 635. If the voltage summation value exceeds the threshold value configured through the comparator 635, the protective circuit 630 may recognize that an overload signal has occurred and may adjust the output of the bias circuit.

Figure 7:
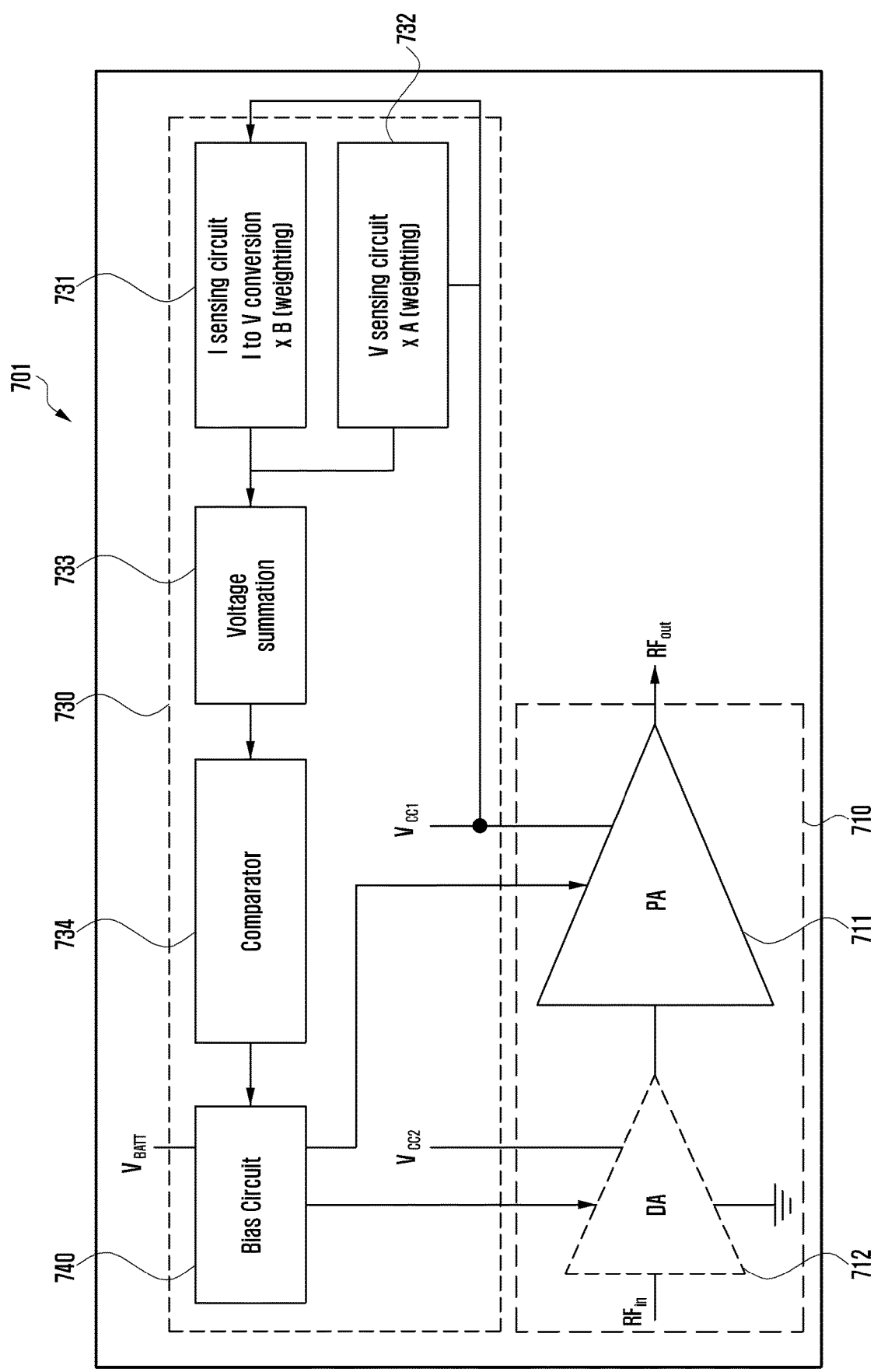
FIG. 7 illustrates a structure of a power amplification module of an electronic device according to an embodiment of the disclosure.

FIG. 7 illustrates a structure of a power amplification module of an electronic device according to an embodiment of the disclosure.

Referring to FIG. 7, a power amplification module 701 (for example, power amplification module 301 of FIG. 3) of an electronic device (for example, electronic device 101 of FIG. 1) according to an embodiment may include an amplification circuit 710 and a protective circuit 730.

According to an embodiment, the protective circuit 730 may control such that a bias current is applied to the amplification circuit 710 so as to amplify signals, and may operate so as to protect the amplification circuit 710 with reference to a value obtained by summating currents and voltages sensed by the amplification circuit 710 based on a voltage parameter.

According to an embodiment, the protective circuit 730 may include a current sensing/conversion circuit (I sensing circuit & I to V conversion) 731, a voltage sensing circuit (V sensing circuit) 732, a summation circuit (voltage summation) 733, a comparison circuit (comparator) 734, and a bias circuit 740.

According to an embodiment, the protective circuit 730 may include the bias circuit 740 but is not limited thereto. The bias circuit 740 may be implemented separately from the protective circuit 730.

According to an embodiment, the amplification circuit 710 may include at least one of a driver amplifier (DA) 712 and a power amplifier (PA) 711 configured to amplify a gain-adjusted RF signal. The amplification circuit 710 and the bias circuit 740 operate in the same manner as the amplification circuit 510 and the bias circuit 540 of FIG. 5, and a repeated description thereof will be omitted herein.

According to an embodiment, the current sensing/conversion circuit 731 may sense a current flowing to the collector end of the transistor included in the amplification circuit 710, may change the sensed current into a voltage (for example, first voltage), and may deliver the first voltage to the summation circuit. According to an embodiment, the current sensing/conversion circuit 731 may multiply the first voltage by a predetermined amplification ratio B and deliver the resulting value to the summation circuit 733.

According to an embodiment, the voltage sensing circuit 732 may be connected to a power supply voltage (for example, Vcc) applied to the amplification circuit 710, may sense the voltage (for example, second voltage) applied to the amplification circuit 710, and may deliver the same to the summation circuit 733. According to an embodiment, the voltage sensing circuit 732 may multiply the second voltage by a predetermined amplification ratio A and deliver the resulting value to the comparator 734.

According to an embodiment, the summation circuit 733 may summate the first and second voltages and deliver the summation value (Vtotal) to the comparator 734. The summation circuit 733 may multiply the first voltage by B, multiply the second voltage by A, summate the same, and deliver the summation value to the comparator 734.

According to an embodiment, the comparator 734 may determine whether the summation value (Vtotal) exceeds a configured threshold value and, if it is determined that the summation value (Vtotal) exceeds the configured threshold value, deliver an overload signal to the bias circuit 740.

According to an embodiment, if the overload signal is received from the comparator 734, the bias circuit 740 may make adjustment such that the output value of the bias circuit 740 decreases. Alternatively, if the overload signal is received from the comparator 734, the bias circuit 740 may control such that power supply applied to the power amplification module 701 is blocked.

Figure 8:
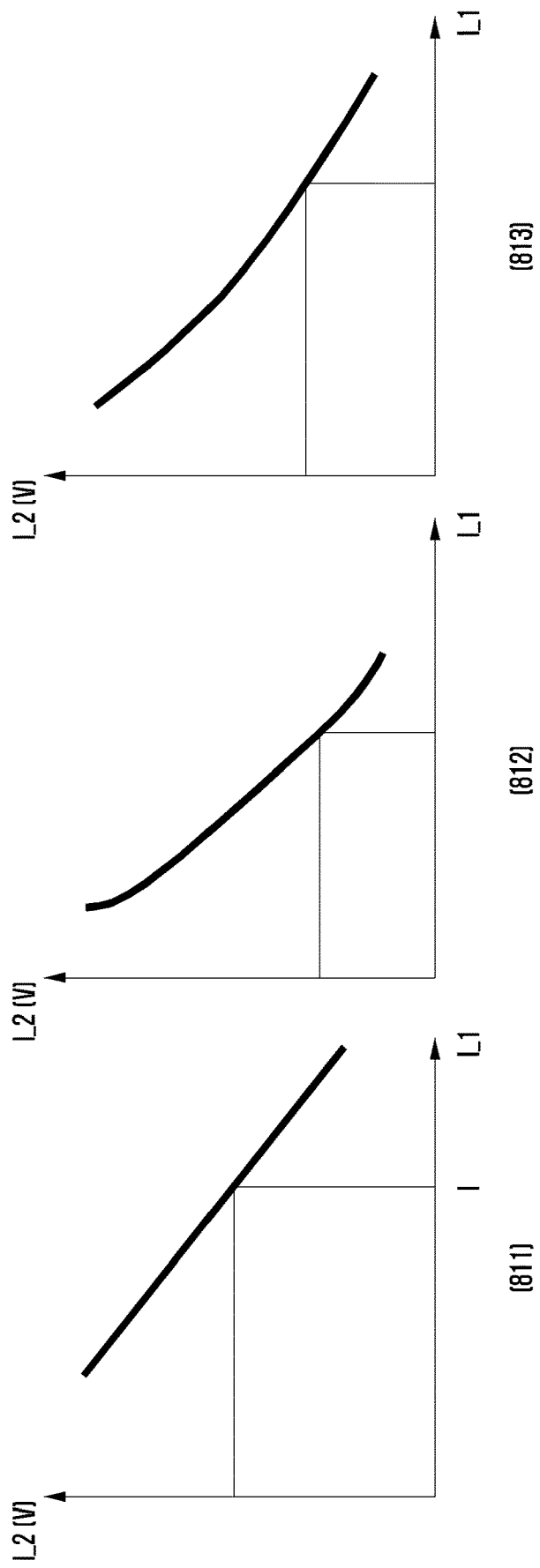
FIG. 8 illustrates a change in a boundary of a configuration range for protecting safe operation of an amplification circuit according to an embodiment of the disclosure.

FIG. 8 illustrates a change in a boundary of a configuration range for protecting safe operation of an amplification circuit according to an embodiment of the disclosure.

Referring to FIG. 8, a power amplification module (for example, power amplification module 301 of FIG. 3) of an electronic device according to various embodiments (for example, electronic device 101 of FIG. 1) may have an amplification circuit (for example, amplification circuit 510 of FIG. 5) implemented such that the same is driven with reference to a summation value obtained by assigning weights to currents and voltages sensed by the amplification circuit and summating the same, and operates within the boundary of an operating area (for example, SOA and FOA) having a load line configured so as to be changed not only by element characteristics, but also by external factors. For example, the load line of the amplification circuit may have a difference between an ideal load line and an actually measured load line as illustrated in FIG. 2B. In FIG. 8, 811 refers to a boundary for protecting the SOA and the FOA if the first current is multiplied by A=1 and the second current is multiplied by B=1. The boundary 811 may be understood as a simple straight-line boundary. In FIG. 8, 812 refers to a boundary change for protecting the SOA and the FOA if the first current is multiplied by A=1 and the second current is multiplied by B=1.1. Also in FIG. 8, 813 refers to a boundary change for protecting the SOA and the FOA if the first current is multiplied by A=0.65 and the second current is multiplied by B=1.1.

According to an embodiment, if a boundary shape for protecting the SOA or FOA is caused by element characteristics of the amplification circuit and external factors, the power amplification module may be configured such that the amplification circuit operates along the line of the boundary for protecting the SOA or FOA, such as 813.

According to another embodiment, if a boundary shape such as 813 is caused by element characteristics of the amplification circuit and external factors, the power amplification module may be configured to convert a voltage into a first current, to multiply the same by a weight of 0.65, and to summate the same, and may be configured to multiply a second current corresponding to a current by a weight of 1.1 and to summate the same. In connection with determining whether the amplification circuit exceeds the configured operating range, the power amplification module may determine the operating range with reference to a boundary that reflects a summation value obtained by assigning weights to currents and voltages, thereby improving the effect of suppressing loss that may occur in the power amplification module.

According to various embodiments, an electronic device (for example, electronic device 101 of FIG. 1) may include an antenna (for example, antenna 305 of FIG. 3), an amplification circuit (for example, amplification circuit 310 of FIG. 3) configured to amplify a signal to be transmitted through the antenna, a first sensing circuit (for example, current sensing circuit 320 of FIG. 3) configured to sense first information corresponding to a voltage value of power supplied to the amplification circuit, a second sensing circuit (voltage sensing circuit 325 of FIG. 3) configured to sense second information corresponding to a current value of the power, and a protective circuit (for example, protective circuit 330 of FIG. 3). The protective circuit may be configured to summate the first information and the second information into a single parameter, to determine whether a summation value corresponding to the single parameter deviates from an operating area determined by characteristics of the amplification circuit, and to adjust an output of the amplification circuit if the summation value deviates from the operating area.

According to various embodiments, the electronic device may further include a bias circuit configured to supply a bias current to the amplification circuit, and the protective circuit may be configured to deliver a signal for adjusting the output of the amplification circuit through the bias circuit.

According to various embodiments, the protective circuit may be configured to refrain from supplying power to the amplification circuit if the summation value deviates from the operating area.

According to various embodiments, the protective circuit may be configured to multiply the first information by weight A (e.g., a first weight), to multiply the second information by weight B (e.g., a second weight), to convert the multiplied first information and second information into the single parameter so as to obtain the summation value, and to determine whether the summation value deviates from the determined operating area.

The weight A (e.g., the first weight) and the weight B (e.g., the second weight) may be adjusted so as to operate within a boundary of an operating area determined by element characteristics of the amplification circuit.

According to various embodiments, the electronic device may further include a conversion circuit configured to convert the first information or the second information into a designated parameter, and the protective circuit may be configured to measure the summation value corresponding to the single parameter at least based on the first information or second information converted through the conversion circuit.

According to various embodiments, the protective circuit may be configured to convert the summation value into a voltage summation value or a current summation value for overload monitoring of the amplification circuit, and the protective circuit may be configured to determine whether the converted voltage summation value or current summation value deviates from the operating area, based on a threshold value configured so as not to exceed the operating area.

According to various embodiments, the operating area may include an at least partially overlapping area between a first operating area determined according to characteristics of a heterojunction bipolar transistor (HBT) element and a second operating area reduced compared with the first operating area in view of microwave-based operating frequency characteristics, and the protective circuit may be configured such that a voltage or current applied to the amplification circuit is varied within the operating area.

According to various embodiments, the threshold value may be configured so as not to exceed an at least partially overlapping area between the first operating area and a second area based on an operating frequency, and the protective circuit may be configured to adjust the bias current applied to the amplification circuit if the voltage summation value or the current summation value exceeds the threshold value.

According to various embodiments, the electronic device may further include a signal processing module and a power supply control module formed on a complementary metal oxide semiconductor (CMOS) substrate, the amplification circuit and the protective circuit may be formed on a heterojunction bipolar transistor (HBT) substrate, the CMOS substrate and the HBT substrate may be electrically connected to each other, and the first sensing circuit and the second sensing circuit may be formed on at least one of the CMOS substrate and the HBT substrate.

According to various embodiments, the protective circuit may further include: a bias circuit configured to apply a bias to the amplification circuit, a summation circuit configured to summate the first information and the second information into a single parameter, and a comparison circuit configured to compare a voltage applied to the amplification circuit, based on a summation value from the summation circuit.

According to various embodiments, the protective circuit may be configured to control the bias circuit such that output of the amplification circuit decreases if the summation value deviates from an operating area determined by characteristics of the amplification circuit.

According to various embodiments, the protective circuit may be configured such that, if the summation value is included in the operating area, the output value of the amplification circuit is not adjusted, and an output of the signal is maintained.

Figure 9:
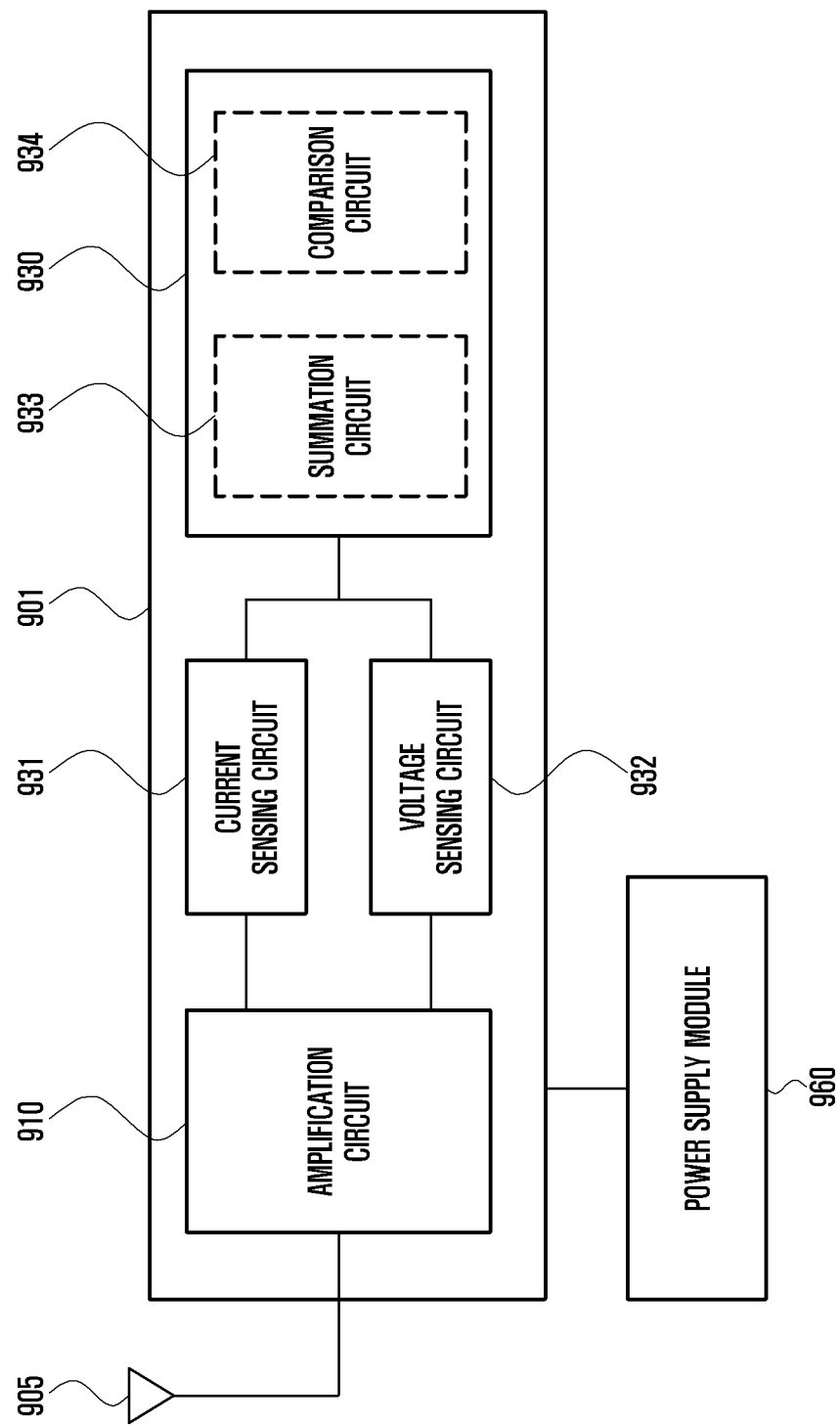
FIG. 9 illustrates a structure of an electronic device including a power amplification module according to an embodiment of the disclosure.

FIG. 9 illustrates a structure of an electronic device including a power amplification module according to an embodiment of the disclosure.

Referring to FIG. 9, an electronic device according to an embodiment (for example, electronic device 101 of FIG. 1) may include a power amplification module 901 and a power supply module 960.

The power amplification module 901 according to an embodiment may include an amplification circuit 910 (for example, power amplification circuit of FIG. 2A or amplification circuit 310 of FIG. 3) and a protective circuit 930 (for example, protective circuit 330). According to an embodiment, the protective circuit 930 may include at least some of a current sensing circuit 931 (for example, current sensing circuit 331 of FIG. 3), a voltage sensing circuit 932 (for example, voltage sensing circuit 325 of FIG. 3), a summation circuit 933 (for example, summation circuit 333 of FIG. 3), and/or a comparison circuit 934 (for example, comparison circuit 334 of FIG. 3). For example, at least some of the current sensing circuit 931, the voltage sensing circuit 932, and/or the summation circuit 933 may include a conversion circuit (not illustrated) configured to change a current or a voltage into a single parameter.

According to an embodiment, the amplification circuit 910 may amplify an input end signal (RFin) delivered from an RF processing module (for example, RFIC) by using a bias voltage, and may deliver the amplified signal to an antenna 905. The amplified RF signal may be output to the antenna 905 through the output end (RFout). For example, the amplification circuit 910 may be configured in the structure of the power amplification circuit 210 of FIG. 2A, but is not limited thereto.

According to an embodiment, the amplification circuit 910 may include at least one of a driver amplifier (DA) configured to adjust the gain of a signal input through the input end and a power amplifier (PA) configured to amplify the gain-adjusted RF signal.

The amplification circuit 910 may receive, as a power supply, a DC-DC voltage or a battery voltage (V-batt) input from the power supply module 960, may amplify the input signal, and may output the same to the output end (RFout). The remaining configuration of the amplification circuit 910 is identical to that of the amplification circuit 310 of FIG. 3, and a repeated description thereof will be omitted herein.

The power supply module 960 according to an embodiment may include at least one of a DC-DC converter, a power management integrated circuit (PMIC), or a battery. For example, if the PA bias value of the power amplification module 901 is delivered from the processor of the electronic device, the power supply module 960 may supply a bias current by using power supplied from the battery.

The power supply module 960 according to an embodiment may adjust the magnitude of the bias current such that the output of the amplification circuit 910 is adjusted by the overload signal of the amplification circuit 910, delivered from the protective circuit 930, or may block power supply to the power amplification module 901.

According to an embodiment, the protective circuit 930 may confirm (for example, sensor) whether the current or voltage flowing through the amplification circuit 910 exceeds a configured threshold while a bias current is applied to the amplification circuit 910 so as to amplify signals. Accordingly, the protective circuit 930 may determine whether the amplification circuit 910 is driven within an operating area range configured such that the same can operate safely, and may deliver an overload signal to the power supply module 960 if the same is out of the configured operating area.

According to an embodiment, the current sensing circuit 931 may be connected to the collector end of a transistor included in the amplification circuit 910 and may sense a current flowing to the transistor through the power supply voltage (for example, Vcc) applied to the amplification circuit 910.

According to an embodiment, the voltage sensing circuit 932 may be connected to the line of power supply (Vcc) of the amplification circuit 910, and may sense the voltage applied to the amplification circuit 910.

According to an embodiment, the summation circuit 933 may summate a current sensed through the current sensing circuit 931 and a voltage sensed through the voltage sensing circuit 932 into a single parameter, and may deliver the summation value of current and voltage to the comparison circuit 934. The summation value of current and voltage may be referred to as a voltage summation (Vtotal) value, but is not limited thereto.

For example, the summation circuit 933 may be configured such that a weight is assigned to each current or voltage according to the characteristics of the transistor element included in the amplification circuit 910, thereby confirming the summation value. For example, the summation circuit 933 may be configured such that a voltage sensed through the voltage sensing circuit 932 is multiplied by weight A, a current sensed through the current sensing circuit 931 is multiplied by weight B, and the summation value is confirmed. For example, the summation value may be confirmed by using a first-order equation of $(A*x)+(B*y)$, but an equation of the second or higher order may be used in some cases. In the equation, x and y may correspond to values obtained by changing a circuit current sensed through current sensing or a voltage sensed through voltage sensing into a single parameter.

According to an embodiment, the comparison circuit 934 may determine whether the summation value delivered from the summation circuit 933 deviates from the operating area configured such that the amplification circuit 910 can operate safely. If the summation value is outside the configured operating area, the comparison circuit 934 may deliver an overload signal to the power supply module 960 so as to inform that the amplification circuit 910 is outside the configured operating area.

For example, the power supply module 960 may conduct a control such that, if an overload signal of the amplification circuit 910 is received from the comparison circuit 934, the bias current applied to the amplification circuit 910 decreases. As another example, the power supply module 960 may conduct a control such that, if the overload signal is received, power supply to the power amplification module 901 is blocked.

Figure 10:
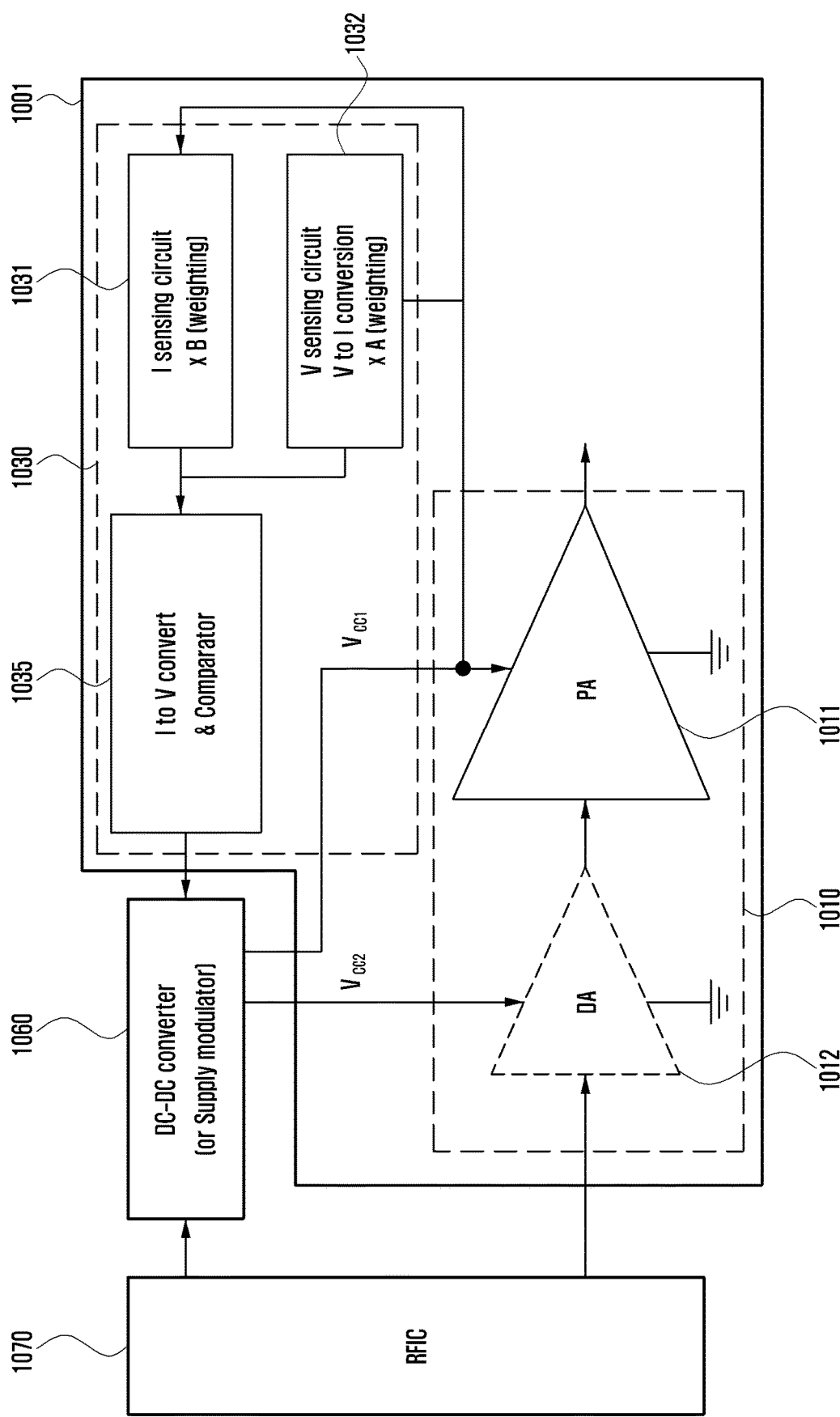
FIG. 10 illustrates a structure of an electronic device including a power amplification module according to an embodiment of the disclosure.

FIG. 10 illustrates a structure of an electronic device including a power amplification module according to an embodiment of the disclosure.

Referring to FIG. 10, a power amplification module 1001 (for example, power amplification module 901 of FIG. 9) of an electronic device according to an embodiment (for example, electronic device 101 of FIG. 1) may be connected to an RF processing module (for example, RFIC) 1070 and a power supply source (for example, DC-DC converter or supply modulator) 1060. The power amplification module 1001 may include an amplification circuit 1010 and a protective circuit 1030. The protective circuit 1030 may control such that a bias current is applied to the amplification circuit 1010 so as to amplify signals, and may operate so as to protect the amplification circuit 1010 with reference to a value obtained by summating currents and voltages sensed by the amplification circuit 1010 based on a current parameter.

According to an embodiment, the RF processing module (for example, RFIC) 1070 may process an RF signal to be output to an antenna, and may deliver the RF signal through the input end of the power amplification module 1001. The RF processing module 1070 may include at least one of a transmission/reception module (for example, transceiver) or a transmission module (for example, transmitter) and a reception module (for example, receiver), a low-noise amplifier for RF signal processing, a mixer, and a converter.

According to an embodiment, the power supply source 1060 may control such that, if an overload signal of the amplification circuit 1010 is received from protective circuit 1030 of the power amplification module 1001, power supply to the amplification circuit 1010 is blocked.

According to an embodiment, the power supply source 1060 may supply a bias current to the amplification circuit 1010 under the control of the processor (not illustrated) of the electronic device.

According to an embodiment, the amplification circuit 1010 may include at least one of a driver amplifier (DA) 1012 configured to adjust the gain of a signal input through the input end and a power amplifier (PA) 1011 configured to amplify the gain-adjusted RF signal. The DA 1012 of the amplification circuit 1010 may be omitted, but is not limited thereto. The amplification circuit 1010 may amplify and output an input signal by receiving a DC-DC voltage or battery voltage (V-batt) applied thereto as a power supply (for example, Vcc1or Vcc2).

According to an embodiment, the protective circuit 1030 may include a current sensing circuit (I sensing circuit) 1031, a voltage sensing/conversion circuit (V sensing circuit & V to I conversion) 1032, and a comparison circuit (comparator) 1035. The comparator 1035 may further include a current-voltage converter.

According to an embodiment, the current sensing circuit 1031 may sense a current flowing to a collector end of a transistor included in the amplification circuit 1010, may generate a mirrored current (for example, first current) with reference to the sensed current, and may deliver the same to the comparator 1035. According to an embodiment, the current sensing circuit 1031 may multiply the first current by a predetermined amplification ratio B and deliver the resulting value to the comparator 1035.

According to an embodiment, the voltage sensing/conversion circuit 1032 may be connected to the power supply voltage (for example, Vcc) applied to the amplification circuit 1010 so as to sense the voltage applied to the amplification circuit 1010, to convert the sensed voltage into a current, to generate a mirrored current (for example, second current) with reference to the converted current, and to deliver the same to the comparator 1035. According to an embodiment, the voltage sensing/conversion circuit 1032 may multiply the second current by a predetermined amplification ratio A and deliver the resulting value to the comparator 1035.

According to an embodiment, the amplification ratio B by which the first current is multiplied and the amplification ratio A by which the second current is multiplied may be changed differently according to characteristics of the HBT element, and may be determined so as to correspond to the boundary shape of the configured operating area (for example, SOA and FOA ranges).

According to an embodiment, the comparator 1035 may summate delivered first and second currents and may deliver an overload signal to the bias circuit if the summation value of the first and second currents exceeds a configured threshold value. The comparator 1035 may configure the threshold value such that the operating area in which elements can operate safely (for example, SOA and FOA ranges) are not exceeded.

According to an embodiment, the current summation value (Itotal) may be changed to a voltage value (Vtotal) for monitoring the overloading of the amplification circuit 1010. The comparator 1035 may determine whether the configured threshold value is exceeded with reference to the voltage value (Vtotal) of monitoring.

According to an embodiment, the comparator 1035 may assign weights to the amplification ratio B by which the first current is multiplied and the amplification ratio A by which the second current is multiplied, respectively, and summate the same, thereby determining whether the amplification circuit is operating within the configured operating area (for example, SOA and FOA ranges). If a threshold value corresponding to an operating range configured with reference to the summation value obtained by assigning weights is exceeded, the comparator 1035 may deliver an overload signal of the amplification circuit 1010 to the power supply source 1060. The power supply source 1060 may control such that, if the overload signal of the amplification circuit 1010 is received, power supply to the amplification circuit 1010 is blocked.

Figure 11:
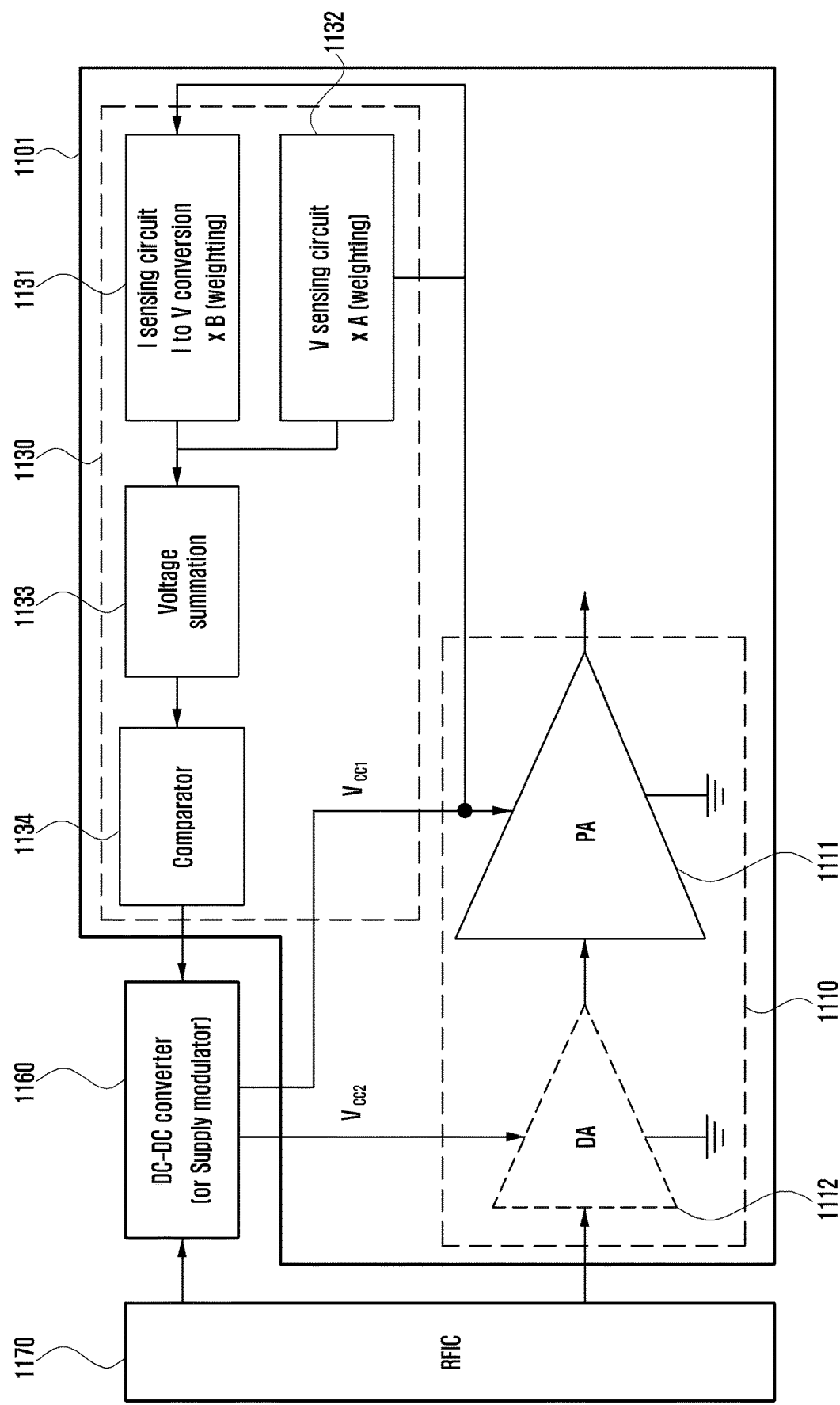
FIG. 11 illustrates a structure of a power amplification module of an electronic device according to an embodiment of the disclosure.

FIG. 11 illustrates a structure of a power amplification module of an electronic device according to an embodiment of the disclosure.

Referring to FIG. 11, a power amplification module 1101 (for example, power amplification module 901 of FIG. 9) of an electronic device according to an embodiment (for example, electronic device 101 of FIG. 1) may be connected to a RF processing module (for example, RFIC) 1170 and a power supply source (for example, DC-DC converter or supply modulator) 1160. The power amplification module 1101 may include an amplification circuit 1110 and a protective circuit 1130, and may operate so as to protect the amplification circuit 1110 with reference to a value obtained by summating currents and voltages sensed by the amplification circuit 1110 based on a voltage parameter.

According to an embodiment, the RF processing module (for example, RFIC) 1170, the power supply source 1160, and the amplification circuit 1110 operate in the same manner as the RF processing module (for example, RFIC) 1070, the power supply source 1060, and the amplification circuit 1010 of FIG. 10 operate, and a repeated description thereof will be omitted herein. The amplification circuit 1110 may include at least one of a driver amplifier (DA) 1112 and a power amplifier (PA) 1111 configured to amplify the gain-adjusted RF signal, but is not limited thereto.

According to an embodiment, the protective circuit 1130 may include a current sensing/conversion circuit (I sensing circuit & I to V conversion) 1131, a voltage sensing circuit (V sensing circuit) 1132, a summation circuit (voltage summation) 1133, and a comparison circuit (comparator) 1134.

According to an embodiment, the current sensing/conversion circuit 1131 may sense a current flowing to a collector end of a transistor included in the amplification circuit 1110, may change the sensed current into a voltage (for example, first voltage), and may deliver the first voltage to the summation circuit 1133. According to an embodiment, the current sensing/conversion circuit 1131 may multiply the first voltage by a predetermined amplification ratio B and deliver the resulting value to the summation circuit 1133.

According to an embodiment, the voltage sensing circuit 1132 may be connected to a power supply voltage (for example, Vcc) applied to the amplification circuit 1110, may sense the voltage (for example, second voltage) applied to the amplification circuit 1110, and may deliver the same to the summation circuit 1133. According to an embodiment, the voltage sensing circuit 1132 may multiply the second voltage by a predetermined amplification ratio A and deliver the resulting value to the summation circuit 1133.

According to an embodiment, the summation circuit 1133 may summate the first and second voltages and deliver the summation value (Vtotal) to the comparator 1134. The summation circuit 1133 may multiply the first voltage by B, may multiply the second voltage by A, may summate the same, and may deliver the summation value to the comparator 1134.

According to an embodiment, the comparator 1134 may determine whether the summation value Vtotal exceeds a configured threshold value and, if it is determined that the summation value Vtotal exceeds a configured threshold value, may deliver an overload signal to the power supply source 1160.

According to an embodiment, the power supply source 1160 may control such that, if an overload signal is received from the comparator 1134, the output of the bias voltage supplied to the amplification module 1110 decreases.

According to an embodiment, the power supply source 1160 may control such that, if an overload signal of the amplification circuit 1010 is received from protective circuit 1130 of the power amplification module 1101, power supply to the amplification circuit 1110 is blocked.

Figure 12:
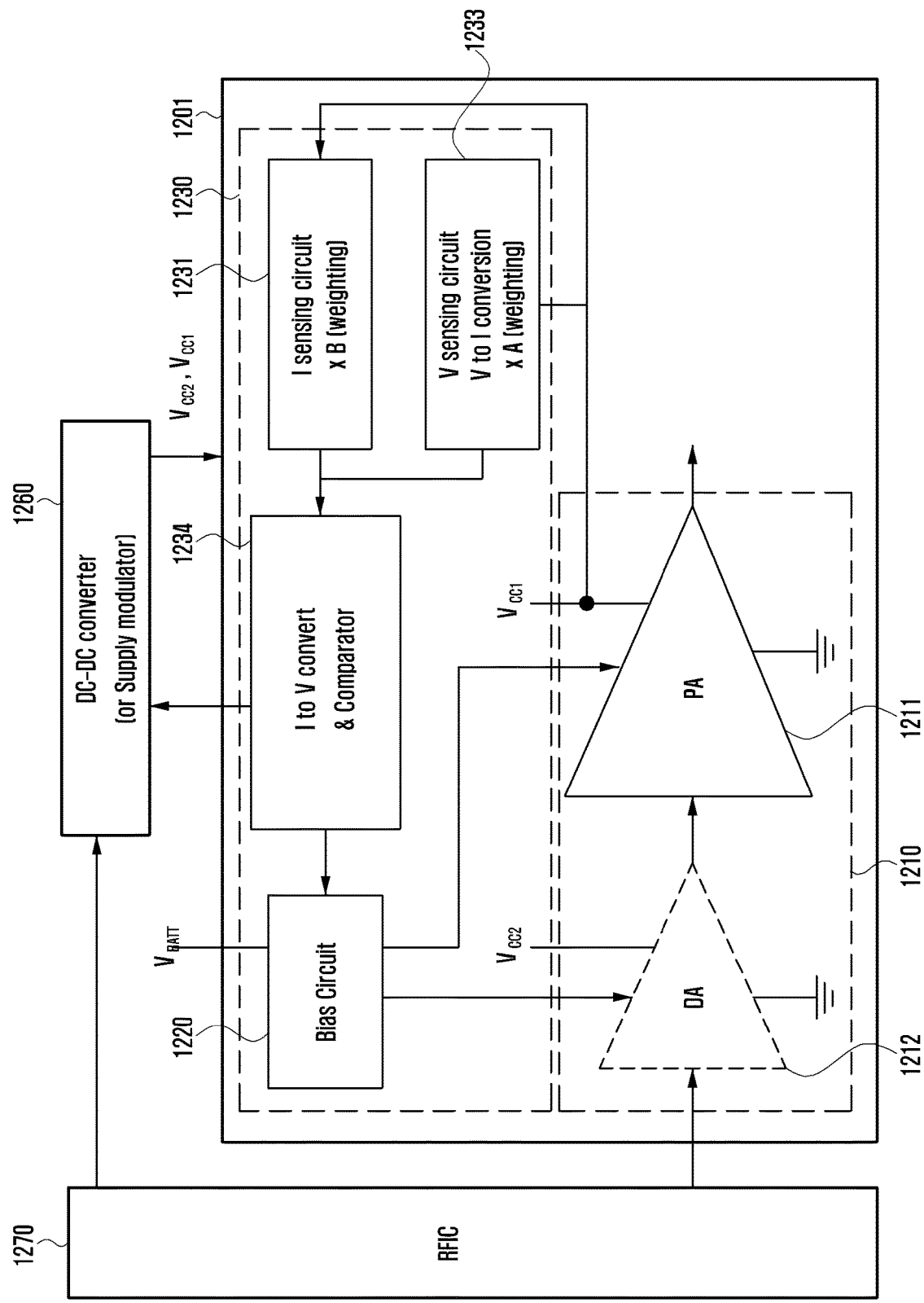
FIG. 12 illustrates a structure of an electronic device including a power amplification module according to an embodiment of the disclosure.

FIG. 12 illustrates a structure of an electronic device including a power amplification module according to an embodiment of the disclosure.

Referring to FIG. 12, a power amplification module 1201 (for example, power amplification module 901 of FIG. 9) of an electronic device according to an embodiment (for example, electronic device 101 of FIG. 1) may be connected to a RF processing module (for example, RFIC) 1270 and a power supply source (for example, DC-DC converter or supply modulator) 1260. The power amplification module 1201 may include an amplification circuit 1210 including a driver amplifier 1212 and a power amplifier 1211, and a protective circuit 1230. The power amplification module 1201 may operate so as to protect the amplification circuit 1210 with reference to a value obtained by summating currents and voltages sensed by the amplification circuit 1210 based on a current parameter. The RF processing module 1270, the power supply source 1260, and the amplification circuit 1210 operate in the same manner as the RF processing module (for example, RFIC) 1070, the power supply source 1060, and the amplification circuit 1010 of FIG. 10 operate, and a repeated description thereof will be omitted herein.

The power amplification module 1201 according to an embodiment may have the same structure as that of the power amplification module 501 of FIG. 5. The power amplification module 1201 may include a bias circuit 1220, a current sensing circuit (I sensing circuit) 1231, a voltage sensing/conversion circuit (V sensing circuit & V to I conversion) 1233, and a comparison circuit (comparator) 1234. The power amplification module 1201 according to an embodiment may further include a summation circuit (voltage summation). The comparator 1234 may further include a current-voltage converter. Compared with FIG. 5, the comparator 1234 of FIG. 12 may deliver an overload signal to the power supply source 1260 so as to inform that the amplification circuit 1210 is outside the configured operating range. The power supply source 1260 may control such that, if the overload signal of the amplification circuit 1210 is received, power supply to the amplification circuit 1210 is blocked.

Figure 13:
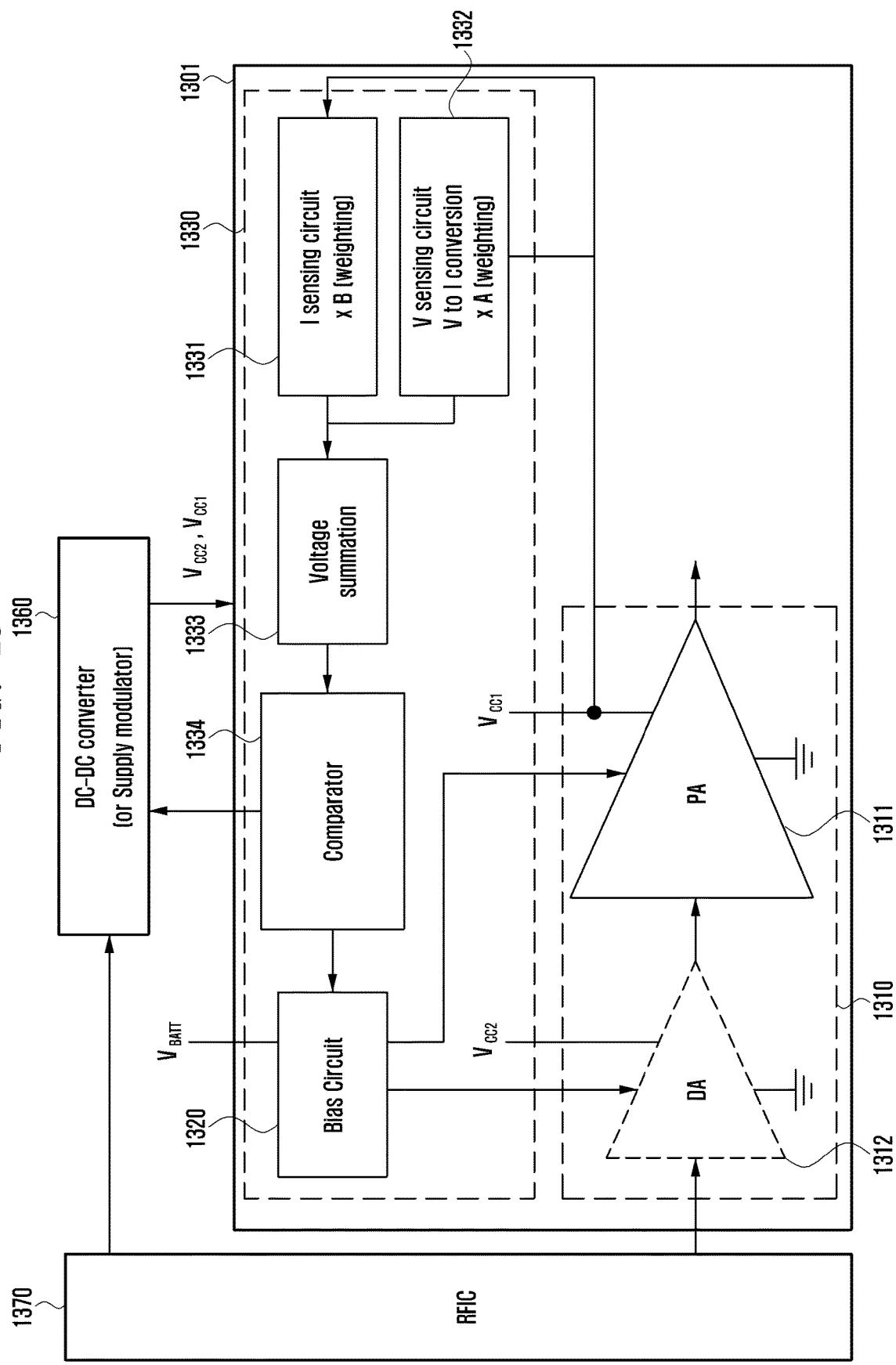
FIG. 13 illustrates a structure of an electronic device including a power amplification module according to an embodiment of the disclosure.

FIG. 13 illustrates a structure of an electronic device including a power amplification module according to an embodiment of the disclosure.

Referring to FIG. 13, a power amplification module 1301 (for example, power amplification module 901 of FIG. 9) of an electronic device according to an embodiment (for example, electronic device 101 of FIG. 1) may be connected to a RF processing module (for example, RFIC) 1370 and a power supply source (for example, DC-DC converter or supply modulator) 1360. The power amplification module 1301 may include an amplification circuit 1310 including at least one of a driver amplifier 1312 and a power amplifier 1311, and a protective circuit 1330. The power amplification module 1301 may operate so as to protect the amplification circuit 1310 with reference to a value obtained by summating currents and voltages sensed by the amplification circuit 1310 based on a current parameter. The RF processing module 1370, the power supply source 1360, and the amplification circuit 1310 operate in the same manner as the RF processing module (for example, RFIC) 1170, the power supply source 1160, and the amplification circuit 1110 of FIG. 11 operate, and a repeated description thereof will be omitted herein.

The power amplification module 1301 according to an embodiment may have a structure similar to that of the power amplification module 701 of FIG. 7. The power amplification module 1301 may include a bias circuit 1320 and the protective circuit 1330 including a current sensing circuit (I sensing circuit) 1331, a voltage sensing/conversion circuit (V sensing circuit and V to I conversion) 1332, a summation circuit (voltage summation) 1333, and a comparison circuit (comparator) 1334.

Compared with FIG. 7, the comparator 1334 of FIG. 13 may deliver an overload signal to the power supply source 1360 so as to inform that the amplification circuit 1310 is outside the configured operating range. The power supply source 1360 may control such that, if the overload signal of the amplification circuit 1310 is received, power supply to the amplification circuit 1310 is blocked.

According to various embodiments, an electronic device (for example, electronic device 101 of FIG. 1) may include an antenna (for example, antenna 905 of FIG. 9), a power supply module (for example, power supply module 960 of FIG. 9), and a power amplification module (for example, power amplification module 901 of FIG. 9) connected to the power supply module. The power amplification module may be configured to amplify, based on an amplification circuit, a signal output to the antenna, to sense first information corresponding to a voltage value of power supplied when the signal is amplified, to sense second information corresponding to a current value of the power, to summate the first information and the second information into a single parameter, to determine whether the summation value corresponding to the single parameter deviates from an operating area determined by element characteristics of the amplification circuit, and to deliver an overload signal to the power supply module if the summation value deviates from the operating area. The power supply module may be configured to adjust the voltage applied to the amplification circuit module if the overload signal is received from the power amplification module.

According to various embodiments, the power amplification module may be configured to multiply the first information by weight A (e.g., a first weight), to multiply the second information by weight B (e.g., a second weight), to convert the multiplied first information and second information into a single parameter so as to obtain a summation value, and to determine whether the summation value deviates from the determined operating area.

According to various embodiments, the weight A (e.g., the first weight) and the weight B (e.g., the second weight) may be adjusted so as to operate within a boundary of an operating area determined by element characteristics of the amplification circuit.

According to various embodiments, the power amplification module may be configured to convert the first information or the second information into a designated parameter and to measure the summation value corresponding to the single parameter, based on the converted first information or second information.

According to various embodiments, the power amplification module may be configured such that a voltage and a current for signal amplification are varied along a load line configured within an at least partially overlapping area between a first operating area determined according to characteristics of a heterojunction bipolar transistor (HBT) element and a second operating area reduced compared with the first operating area in view of microwave-based operating frequency characteristics.

According to various embodiments, the power amplification module may be configured to convert the summation value into a voltage summation value or a current summation value for overload monitoring of the amplification circuit, and the protective circuit is configured to determine whether the converted voltage summation value or current summation value deviates from the operating area, based on a threshold value configured so as not to exceed the operating area.

According to various embodiments, the power amplification module may be configured to deliver an overload signal to the power supply module if the voltage summation value or current summation value is in a range exceeding the configured threshold value.

Figure 14:
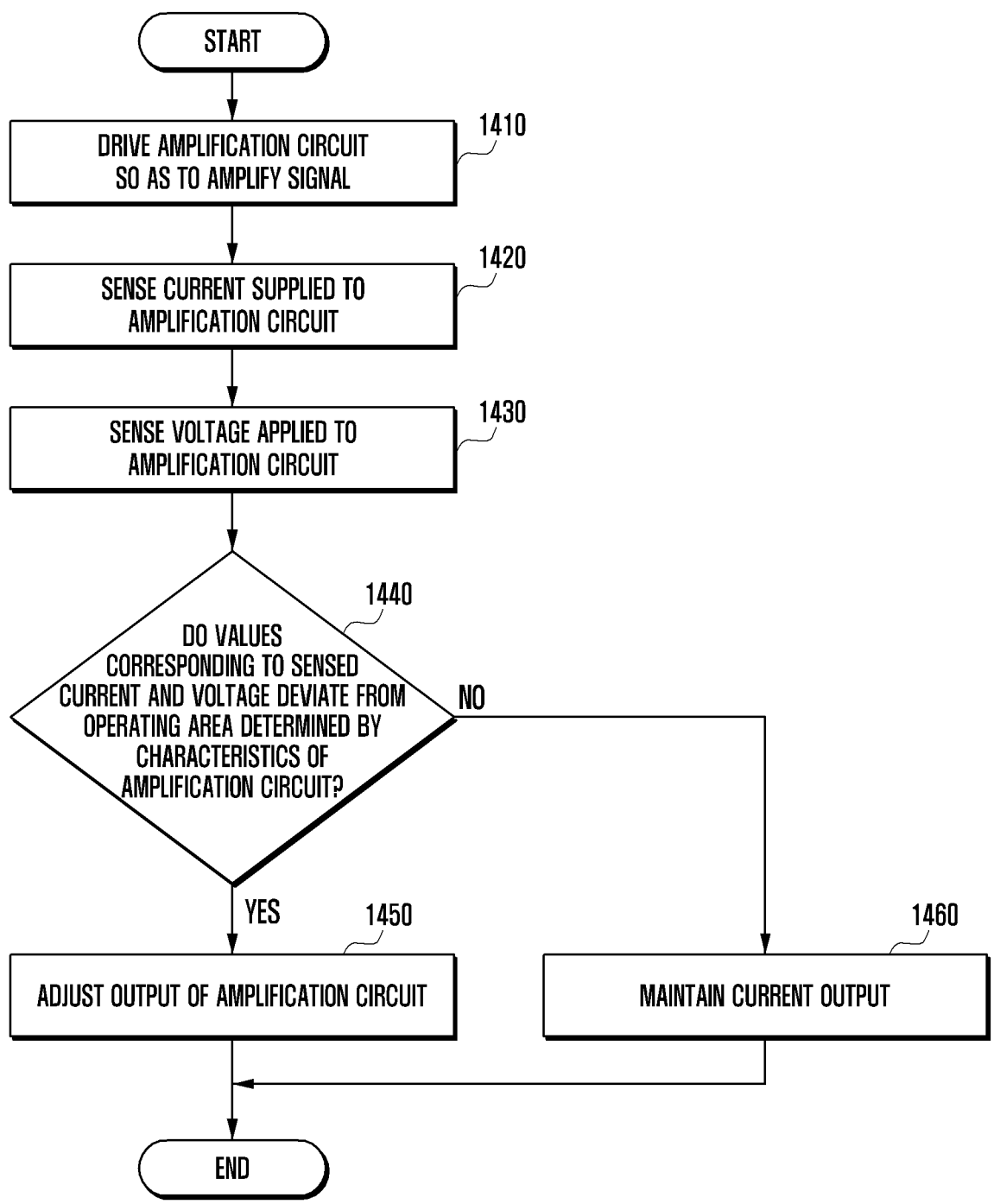
FIG. 14 illustrates a method for adjusting output of a power amplifier of an electronic device according to an embodiment of the disclosure.

FIG. 14 illustrates a method for adjusting output of a power amplifier of an electronic device according to an embodiment of the disclosure.

Referring to FIG. 14, according to various embodiments, a power amplification module (for example, power amplification module 301 of FIG. 3) of an electronic device (for example, electronic device 101 of FIG. 1) may drive an amplification circuit (for example, amplification circuit 310 of FIG. 3) so as to amplify a signal to be output to an antenna (for example, antenna 305 of FIG. 3) under the control of a processor (for example, processor 120 of FIG. 1) of the electronic device in operation 1410.

According to an embodiment, the power amplification module may receive, as a power supply, a DC-DC voltage or a battery voltage V-batt, may amplify a signal input to the amplification circuit, and may output the resulting power signal to the output end RFout.

In operation 1420, the power amplification module may sense a current supplied to the amplification circuit while the amplification circuit is driven. In operation 1430, the power amplification module may sense a voltage applied to the amplification circuit while the amplification circuit is driven.

According to an embodiment, the power amplification module may sense a current flowing to the transistor through the power supply voltage (for example, Vcc) applied to the amplification circuit, and may sense the voltage applied to the power supply (Vcc) line of the amplification circuit.

In operation 1440, the power amplification module may determine whether values corresponding to the sensed current and voltage deviate from an operating area determined by characteristics of the amplification circuit.

According to an embodiment, the operating area determined by characteristics of the amplification circuit may be an at least partially overlapping area between a first operating area determined according to characteristics of an HBT element and a second operating area reduced as compared with the first operating area in view of microwave-based operating frequency characteristics, but is not limited thereto.

According to an embodiment, the power amplification module may change each sensed current or each current into a single parameter, may summate the same, and may compare the same with a threshold value configured so as not to exceed the operating area with reference to the summation value of current and voltage, thereby determining whether the operating area is exceeded.

According to an embodiment, the power amplification module may assign a weight to each current or power according to the characteristics of the transistor element included in the amplification circuit, and may compare the resulting summation value with the threshold value. For example, the power amplification module may multiply a voltage value with weight A, multiply a current value by weight B, and check the resulting summation value.

In operation 1450, the power amplification module may adjust the output of the amplification circuit if values corresponding to the sensed current and voltage deviate from the determined operating area.

According to an embodiment, the power amplification module may control the output of the amplification circuit such that the applied voltage or current can operate within the operating area. For example, the power amplification module may control such that the output of the amplification circuit decreases.

In operation 1460, if the values corresponding to the sensed current and voltage are included in the determined operating area, the power amplification module may control such that the output value of the amplification circuit is not adjusted, and the signal output is maintained.

Figure 15:
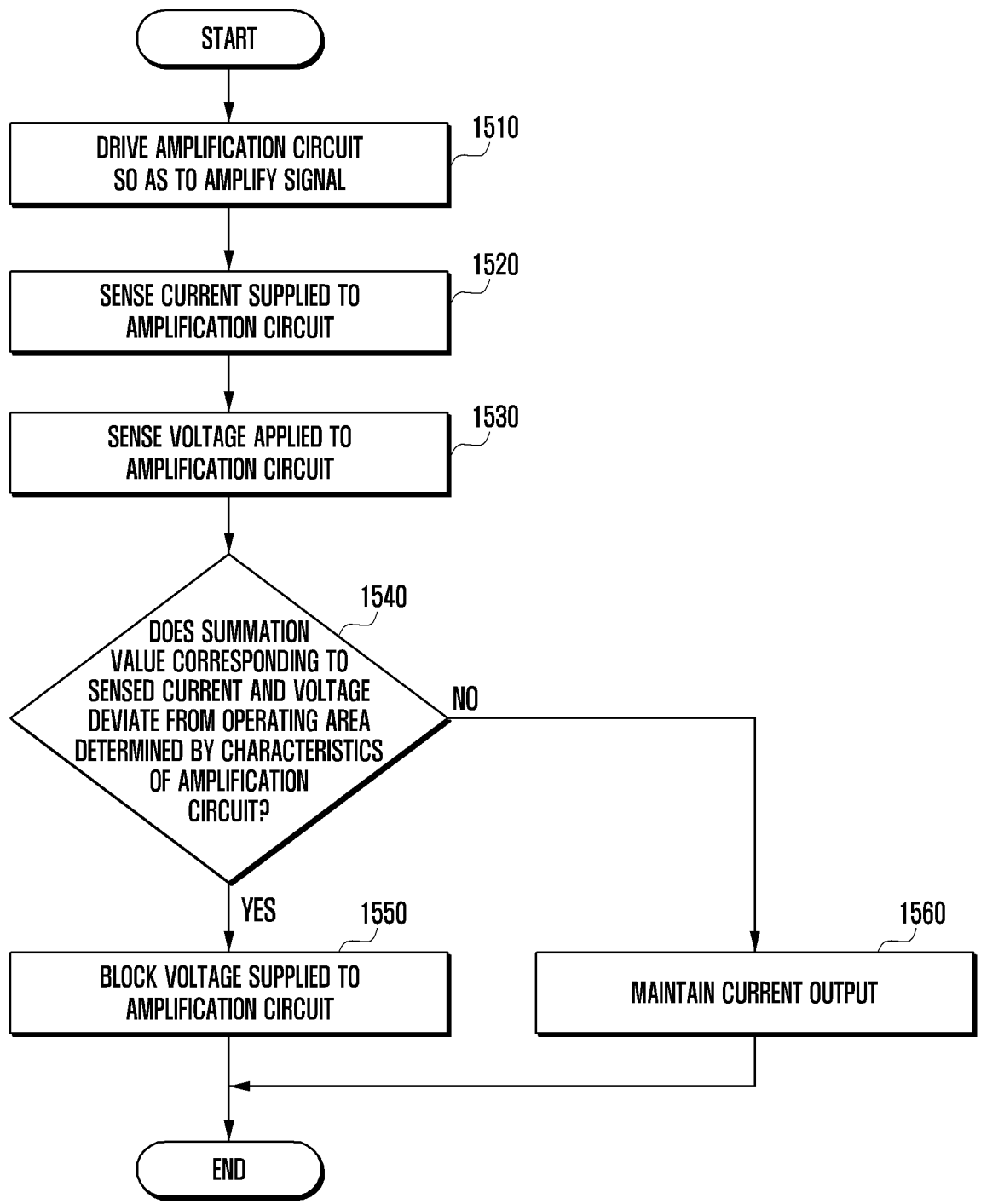
FIG. 15 illustrates a method for adjusting output of a power amplifier of an electronic device according to an embodiment of the disclosure.

FIG. 15 illustrates a method for adjusting output of a power amplifier of an electronic device according to an embodiment of the disclosure.

Referring to FIG. 15, according to various embodiments, a power amplification module (for example, power amplification module 901 of FIG. 9) of an electronic device (for example, electronic device 101 of FIG. 1) may drive an amplification circuit (for example, amplification circuit 910 of FIG. 9) so as to amplify a signal to be output to an antenna (for example, antenna 905 of FIG. 9) under the control of the processor (for example, processor 120 of FIG. 1) of the electronic device in operation 1510.

In operation 1520, the power amplification module may sense a current supplied to the amplification circuit while the amplification circuit is driven. In operation 1530, the power amplification module may sense a voltage applied to the amplification circuit while the amplification circuit is driven.

In operation 1540, the power amplification module may determine whether values corresponding to the sensed current and voltage deviate from an operating area determined by characteristics of the amplification circuit. For example, the power amplification module may determine whether summated values corresponding to the sensed current and voltage deviate from an operating area determined by characteristics of the amplification circuit.

According to an embodiment, the power amplification module may change each sensed current or each current into a single parameter, may summate the same, and may compare the same with a threshold value configured so as not to exceed the operating area with reference to the summation value of current and voltage, thereby determining whether the operating area is exceeded. The operating area may be an at least partially overlapping area between a first operating area determined according to characteristics of an HBT element and a second operating area reduced compared with the first operating area in view of microwave-based operating frequency characteristics, but is not limited thereto.

According to an embodiment, the power amplification module may assign a weight to each current or power according to the characteristics of the transistor element included in the amplification circuit, and may compare the resulting measurement summation value with the threshold value. For example, the power amplification module may multiply a voltage value with weight A, multiply a current value by weight B, and check the resulting summation value.

In operation 1550, the power amplification module may block the voltage supplied to the amplification circuit if values corresponding to the sensed current and voltage deviate from the determined operating area.

According to an embodiment, the power amplification module may block power supplied to the amplification circuit.

According to an embodiment, the power amplification module may deliver an overload signal of the amplification circuit to the power supply module that applies power to the power amplification module. The power amplification module may block power supply applied to the power amplification module in response to the overload signal of the amplification circuit.

In operation 1560, if the values corresponding to the sensed current and voltage are included in the determined operating area, the power amplification module may conduct a control such that the output value of the amplification circuit is not adjusted, and the signal output is maintained.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device #01). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   an antenna;
   an amplification circuit configured to amplify a signal to be transmitted through the antenna;
   a first sensing circuit configured to sense first information corresponding to a voltage value of power supplied to the amplification circuit;
   a second sensing circuit configured to sense second information corresponding to a current value of the power supplied to the amplification circuit; and
   a protective circuit,
   wherein the protective circuit is configured to:
      summate the first information and the second information into a single parameter,
      determine whether a summation value corresponding to the single parameter deviates from an operating area determined by characteristics of the amplification circuit, and adjust an output of the amplification circuit if the summation value deviates from the operating area, and wherein the operating area comprises an at least partially overlapping area between a first operating area determined according to characteristics of a heterojunction bipolar transistor (HBT) element and a second operating area reduced compared with the first operating area in view of microwave-based operating frequency characteristics of the HBT element.

2. The electronic device of claim 1, wherein the electronic device further comprises a bias circuit configured to supply a bias current to the amplification circuit, and wherein the protective circuit is further configured to deliver a signal for adjusting the output of the amplification circuit through the bias circuit.

3. The electronic device of claim 1, wherein the protective circuit is further configured to refrain from supplying power to the amplification circuit if the summation value deviates from the operating area.

4. The electronic device of claim 1,
wherein the protective circuit is further configured to:
multiply the first information by a first weight,
multiply the second information by a second weight,
convert the multiplied first information and the multiplied second information into the single parameter so as to obtain the summation value, and
determine whether the summation value deviates from the determined operating area,
wherein the first weight and the second weight are adjusted so as to operate within a boundary of the operating area.

5. The electronic device of claim 1, wherein the electronic device further comprises a conversion circuit configured to convert the first information or the second information into a designated parameter, and
wherein the protective circuit is further configured to measure the summation value corresponding to the single parameter at least based on the first information or the second information converted through the conversion circuit.

6. The electronic device of claim 1,
wherein the protective circuit is further configured to:
convert the summation value into a voltage summation value or a current summation value for overload monitoring of the amplification circuit, and
based on a threshold value configured so as not to exceed the operating area, determine whether the converted voltage summation value or current summation value deviates from the operating area, and
wherein the protective circuit is further configured such that a voltage or current applied to the amplification circuit is varied within the operating area.

7. The electronic device of claim 6,
wherein the threshold value is configured so as not to exceed the at least partially overlapping area between the first operating area and the second area based on an operating frequency, and
wherein the protective circuit is further configured to adjust a bias current applied to the amplification circuit if the voltage summation value or the current summation value exceeds the threshold value.

8. The electronic device of claim 1,
wherein the electronic device further comprises a signal processing module and a power supply control module formed on a complementary metal oxide semiconductor (CMOS) substrate,
wherein the amplification circuit and the protective circuit are formed on a heterojunction bipolar transistor (HBT) substrate,
wherein the CMOS substrate and the HBT substrate are electrically connected to each other, and
wherein the first sensing circuit and the second sensing circuit are formed on at least one of the CMOS substrate and the HBT substrate.

9. The electronic device of claim 1, wherein the protective circuit further comprises:
a bias circuit configured to apply a bias to the amplification circuit;
a summation circuit configured to summate the first information and the second information into a single parameter; and
a comparison circuit configured to compare a voltage applied to the amplification circuit, based on a summation value from the summation circuit.

10. The electronic device of claim 9, wherein the protective circuit is further configured to control the bias circuit such that the output of the amplification circuit decreases if the summation value deviates from the operating area.

11. The electronic device of claim 9, wherein the protective circuit is further configured such that, if the summation value is included in the operating area, an output value of the amplification circuit is not adjusted, and an output of the signal is maintained.

12. An electronic device comprising:
an antenna;
a power supply module; and
a power amplification module connected to the power supply module,
wherein the power amplification module is configured to:
amplify, based on an amplification circuit, a signal output to the antenna,
sense first information corresponding to a voltage value of power supplied when the signal is amplified,
sense second information corresponding to a current value of the power supplied when the signal is amplified,
summate the first information and the second information into a single parameter,
determine whether a summation value corresponding to the single parameter deviates from an operating area determined by element characteristics of the amplification circuit, and
deliver an overload signal to the power supply module if the summation value deviates from the operating area,
wherein the power supply module is configured to adjust the voltage applied to the amplification circuit if the overload signal is received from the power amplification module, and
wherein the operating area comprises an at least partially overlapping area between a first operating area determined according to characteristics of a heterojunction bipolar transistor (HBT) element and a second operating area reduced compared with the first operating area in view of microwave-based operating frequency characteristics of the HBT element.

13. The electronic device of claim 12, wherein the power amplification module is further configured to:
multiply the first information by a first weight,
multiply the second information by a second weight, convert the multiplied first information and the multiplied second information into a single parameter so as to obtain a summation value, and determine whether the summation value deviates from the determined operating area, wherein the first weight and the second weight are adjusted so as to operate within a boundary of an operating area determined by element characteristics of the amplification circuit.

14. The electronic device of claim 12, wherein the power amplification module is further configured to:

convert the first information or the second information into a designated parameter, and measure the summation value corresponding to the single parameter, based on the converted first information or the second information.

15. The electronic device of claim 12, wherein the power amplification module is further configured such that a voltage and a current for signal amplification are varied along a load line configured within the operating area comprising the at least partially overlapping area between the first operating area and the second operating area.

16. The electronic device of claim 12, further comprising a protective circuit configured to:

convert the summation value into a voltage summation value or a current summation value for overload monitoring of the amplification circuit, based on a threshold value configured so as not to exceed the operating area, determine whether the converted voltage summation value or current summation value deviates from the operating area, and deliver an overload signal to the power supply module if the voltage summation value or the current summation value is in a range exceeding the configured threshold value.

17. A method of adjusting an output of a power amplifier, the method comprising:

amplifying, by an amplification circuit, a signal to be transmitted to an antenna;

sensing first information corresponding to a voltage value of power supplied to the amplification circuit;

sensing second information corresponding to a current value of the power supplied to the amplification circuit;

summating the first information and the second information into a single parameter;

determining whether a summation value corresponding to the single parameter deviates from an operating area determined by characteristics of the amplification circuit; and adjusting an output of the amplification circuit if the summation value deviates from the operating area, wherein the operating area comprises an at least partially overlapping area between a first operating area determined according to characteristics of a heterojunction bipolar transistor (HBT) element and a second operating area reduced compared with the first operating area in view of microwave-based operating frequency characteristics of the HBT element.

18. The method of claim 17, further comprising:

multiplying the first information by a first weight;

multiplying the second information by a second weight;

converting the multiplied first information and the multiplied second information into a single parameter so as to obtain a summation value; and determining whether the summation value deviates from the determined operating area.

19. The method of claim 18, further comprising adjusting the first weight and the second weight so as to operate within a boundary of the operating area.

20. The method of claim 17, further comprising:

converting the summation value into a voltage summation value or a current summation value for overload monitoring of the amplification circuit; and based on a threshold value configured so as not to exceed the operating area, determining whether the converted voltage summation value or the current summation value deviates from the operating area.

* * * * *